United States Patent
Takahashi et al.

(10) Patent No.: US 7,274,238 B2
(45) Date of Patent: Sep. 25, 2007

(54) DIGITAL CIRCUIT HAVING DELAY CIRCUIT FOR ADJUSTMENT OF CLOCK SIGNAL TIMING

(75) Inventors: Eiichi Takahashi, Tsukuba (JP); Yuji Kasai, Tsukuba (JP); Tetsuya Higuchi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 137 days.

(21) Appl. No.: 10/520,429

(22) PCT Filed: Jul. 8, 2003

(86) PCT No.: PCT/JP03/08648

§ 371 (c)(1),
(2), (4) Date: Jul. 13, 2005

(87) PCT Pub. No.: WO2004/017520

PCT Pub. Date: Feb. 26, 2004

(65) Prior Publication Data

US 2006/0109146 A1    May 25, 2006

(30) Foreign Application Priority Data

Jul. 9, 2002    (JP) .............................. 2002-200467

(51) Int. Cl.
  *H03H 11/26*    (2006.01)
(52) U.S. Cl. ...................... 327/276; 327/281; 327/158; 327/161
(58) Field of Classification Search ...................... None
  See application file for complete search history.

(56) References Cited

U.S. PATENT DOCUMENTS

| | | | |
|---|---|---|---|
| 4,259,903 A | | 4/1981 | Arendt et al. |
| 4,899,071 A * | | 2/1990 | Morales ....................... 327/277 |
| 4,922,141 A * | | 5/1990 | Lofgren et al. .............. 327/158 |
| 5,146,121 A * | | 9/1992 | Searles et al. ............... 327/276 |
| 5,216,302 A * | | 6/1993 | Tanizawa ..................... 327/157 |
| 5,614,855 A | | 3/1997 | Lee et al. |
| 5,822,255 A | | 10/1998 | Uchida |
| 5,926,046 A | | 7/1999 | Uchida |
| 5,990,730 A | | 11/1999 | Shinozaki |
| 6,081,146 A * | | 6/2000 | Shiochi et al. .............. 327/277 |
| 6,084,802 A | | 7/2000 | Shinozaki |
| 6,229,364 B1 * | | 5/2001 | Dortu et al. ................. 327/158 |
| 6,741,107 B2 * | | 5/2004 | Borkar et al. ............... 327/153 |
| 7,027,548 B1 * | | 4/2006 | Palusa et al. ................ 375/375 |
| 2002/0140471 A1 * | | 10/2002 | Fiscus ......................... 327/158 |
| 2002/0141527 A1 * | | 10/2002 | Song .......................... 375/376 |

FOREIGN PATENT DOCUMENTS

| | | |
|---|---|---|
| JP | U-03-098534 | 10/1991 |
| JP | A-05-183337 | 7/1993 |
| JP | A-09-321614 | 12/1997 |
| JP | A-09-512966 | 12/1997 |
| JP | A-10-055668 | 2/1998 |
| JP | A-10-079663 | 3/1998 |
| JP | A-2002-163034 | 6/2002 |

* cited by examiner

*Primary Examiner*—Tuan T Lam
(74) *Attorney, Agent, or Firm*—Oliff & Berridge, PLC

(57) ABSTRACT

A digital circuit according to the present invention includes a pulse delay circuit where a driving current of an inverter is variable, for causing timing of a clock signal to be variable; and the pulse delay circuit has a stabilizing circuit for an amount of a pulse delay by a delay synchronizing loop, and a generating circuit for a pulse delay amount setting voltage with nonlinear characteristics. The present invention makes it possible to realize a timing delay circuit with high resolution, which is not influenced by an operating environment and requires only a small area for the circuit.

3 Claims, 19 Drawing Sheets

DIGITAL CIRCUIT HAVING DELAY CIRCUIT FOR ADJUSTMENT OF CLOCK SIGNAL TIMING

TECHNICAL FIELD

The present invention of this application relates to a delay circuit which is applicable to all types of digital circuits such as CPU, ALU, and the like, and particularly relates to a delay circuit which causes the timing of a clock pulse to be variable in a digital processing device using a digital circuit.

BACKGROUND ART

In a digital processing device, it is effective in improvement of the performance of a digital processing device to optimize timing in an actual operation for a clock signal as a reference to timing in an operation of a digital circuit. This has been described in Japanese Patent Laid-Open No. 2001-43261, "Digital System, Clock Signal Adjustment Method for the Digital System, and Recording Medium Recording Process Program To Be Executed According To The Adjustment Method" (hereinafter, referred to as Patent Literature 1). It is also described in Patent Literature 1 that it becomes possible to increase the maximum clock frequency of the digital processing device by adjusting timing of the clock signal thereof by using a genetic algorithm.

Adjustment of a clock signal causes an amount in delay of the clock signal to be variable by using a number of inverters and switching an inverter stage number with a multiplexer. In this method, however, it is necessity to have a large number of inverter circuits for adjustment circuit, resulting in that the ratio of an area occupied with the inverter circuits to an area for IC chips becomes very large. Further, there arises a problem that the amount of the clock signal delay is influenced by an LSI operating environment such as an ambient temperature, voltage, or the like. Further, it is difficult to set the timing finely, and it is impossible, in principal, to set the timing at a shorter interval time than the delay time for one stage of an inverter.

As described above, in such a clock timing adjustment method by prior art, there have been problems that the ratio of an area for the inverter circuits to an area for IC chips is large, and clock timing changes because it is influenced by an LSI operating environment such as an ambient temperature, voltage, or the like. In view of these problems, the problem to be solved by this present invention is to realize a delay circuit with high-resolution timing whose circuit area is small, and which is not influenced by the operating environment.

DISCLOSURE OF THE INVENTION

The digital circuit according to the present invention includes a pulse delay circuit in which a driving current of an inverter is variable to cause timing of a clock signal to be variable; and the pulse delay circuit has a stabilizing circuit for an amount of a pulse delay by a delay synchronizing loop, and a generating circuit for a pulse delay amount setting voltage with nonlinear characteristics.

In the digital processing, this makes it possible to precisely delay the clock signal without being influenced by the operating environment of temperature or voltage, etc, with small chip area.

BEST MODE FOR CARRYING OUT THE INVENTION

First Embodiment

Figure 1:
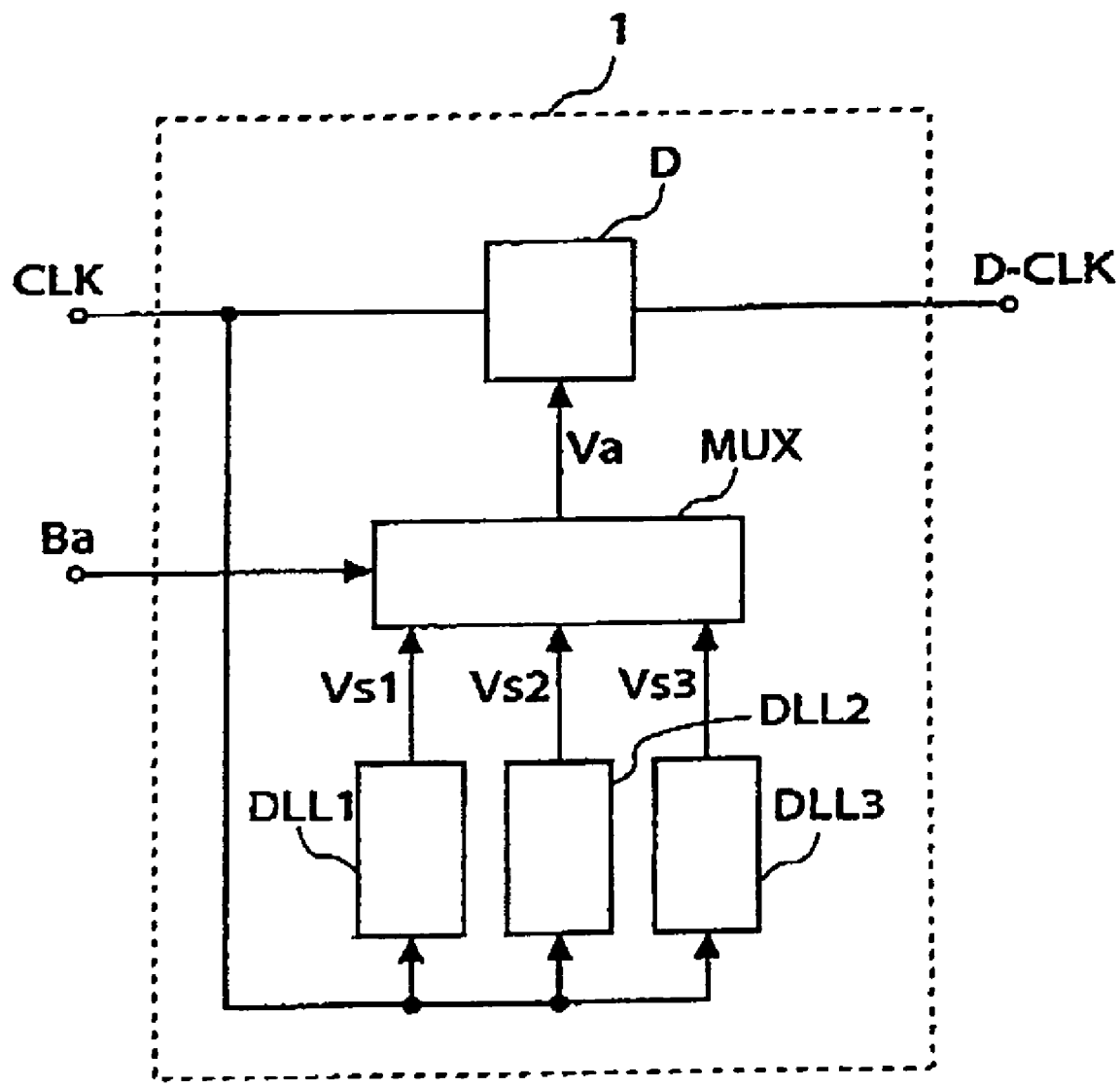
FIG. 1 is an explanatory view showing a configuration of a delay circuit system of the present invention.

A first embodiment of a delay circuit system performing a delay control of a clock signal according to the present invention is described with reference to FIG. 1. In FIG. 1, reference numeral 1 is a delay circuit system of the present invention, D is a delay circuit, MUX is a generating circuit for a delay adjustment voltage, DLL1 to DLL3 are delayed synchronizing loop circuits, respectively (Delay Locked Loop), CLK is a clock input, D-CLK is a clock output, Ba is an adjustment value input, Vs1 to Vs3 are delayed adjustment reference voltages, respectively, and Va is a delayed adjustment voltage.

An object of this circuit system is to output clock-output D-CLK performing the delay time (=τ) corresponding to an adjustment value input Ba for use of setting an amount of delay externally for clock input CLK.

The main components of the present invention are a delay circuit D performing a delay control of a clock signal, a delay adjustment voltage generating circuit MUX generating a delay adjustment voltage Va for setting a delay time τ, and three delay synchronizing loop circuits, DLL1 to DLL3 generating delay adjustment reference voltages Vs1 to Vs3 for adjustment voltage.

There is a case that the delayed adjustment voltage Va is varied linearly, or non-linearly, which is approximated by means of piecewise linear approximation, for an adjustment value input Ba (for example 4 bit: 0~5). Here, piecewise linear approximation is described.

In FIG. 1, clock input CLK is input into the delay circuit D and the three delaying synchronizing loop circuits, DLL1 to DLL3. In the DLLs, DLL1 to DLL3, three delay adjustment reference voltages, Vs1 to Vs3 are generated, and input into the delay adjustment voltage generating circuit MUX. In MUX, a delay adjustment voltage Va corresponding to the adjustment value input Ba is generated.

By controlling the delayed amount of the delay circuit D at this voltage Va, clock output D-CLK having a delay time τ corresponding to an adjustment value Ba can be acquired. The delay time τ has a feature that it is varied by the delayed adjustment voltage Va.

Figure 2:
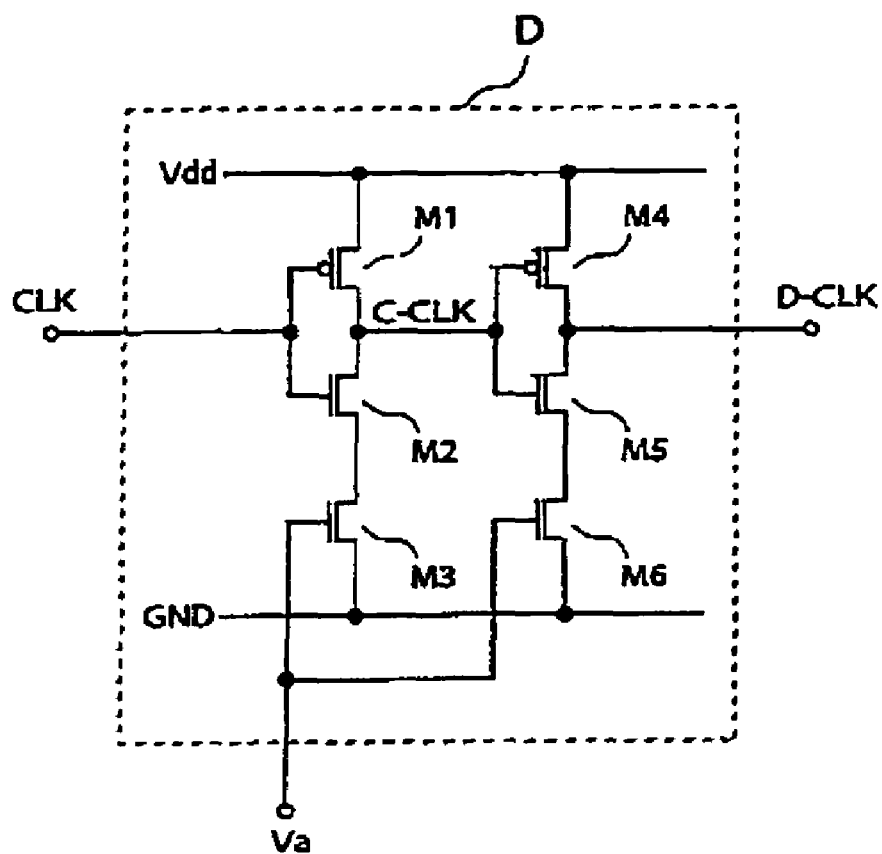
FIG. 2 is a circuit diagram showing an example of a configuration of a delay circuit.

A configuration example of the delay circuit D is described with reference to FIG. 2. In FIG. 2, two inverters are respectively connected in tandem in two stages between a power supply (Vdd) and a ground (GND) as follows, one is an inverter in which one P channel FET (M1) and two N channels FET (M2, M3) are connected in series, while the other is an inverter in which one P channel FET (M4) and two N channels FET (M5, M6) are connected in series. The midpoint of two-stage inverter shall be C-CLK. An FET is a field-effect transistor, and an MOS type structure is usually used. A delay adjustment voltage Va is applied to each gate of the FET, M3 and M6, and the voltage VGS between gate and source is the delay adjustment voltage Va.

Here, FET M1, M2 and M4, M5 constitute an inverter by conventional CMOSFET. FET M3 and M6 can control driving current of the inverter. Clock input CLK is delayed by time τ according to the delay adjustment voltage Va, and becomes the clock output D-CLK. The operation thereof is described as follows.

Figure 3:
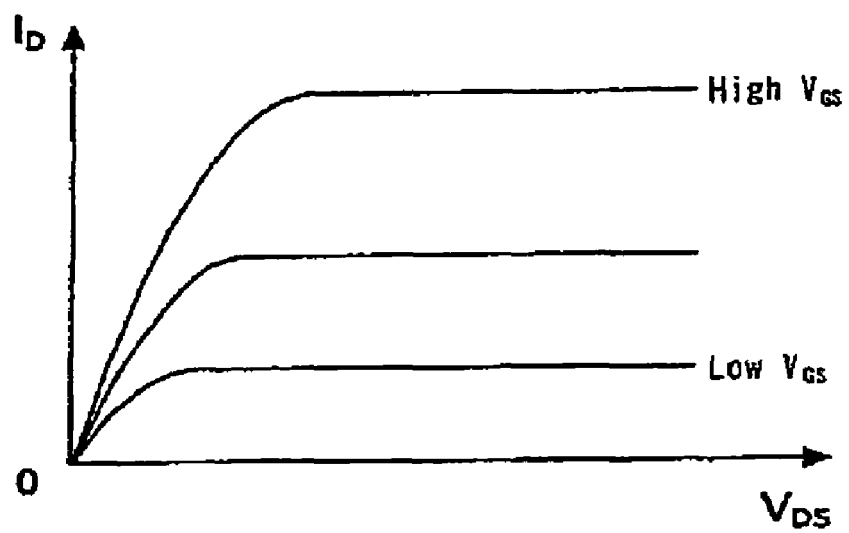
FIG. 3 is a view showing a current-voltage characteristics between source and drain for N channel FET.

In FIG. 3, characteristics of current-voltage between source and drain for voltage VGS between gate and source of N channel FET used in the delay circuit D is shown. In the figure, ID is indicative of drain current, and VDS is indicative of the voltage between source and drain. If the potential difference VGS of the gate terminal G for the source terminal S is small, and is not greater than the threshold voltage of the FET, drain current ID is zero; and if VGS is not less than the threshold voltage of the FET, ID increases with the increase of VGS.

The characteristics of current-voltage between source and drain for the voltage VGS between gate and source of P channel FET, which is used on this delay circuit, is generally equivalent to one where each sign of voltage and current is reversed in the characteristics of the N channel FET.

Figure 4:
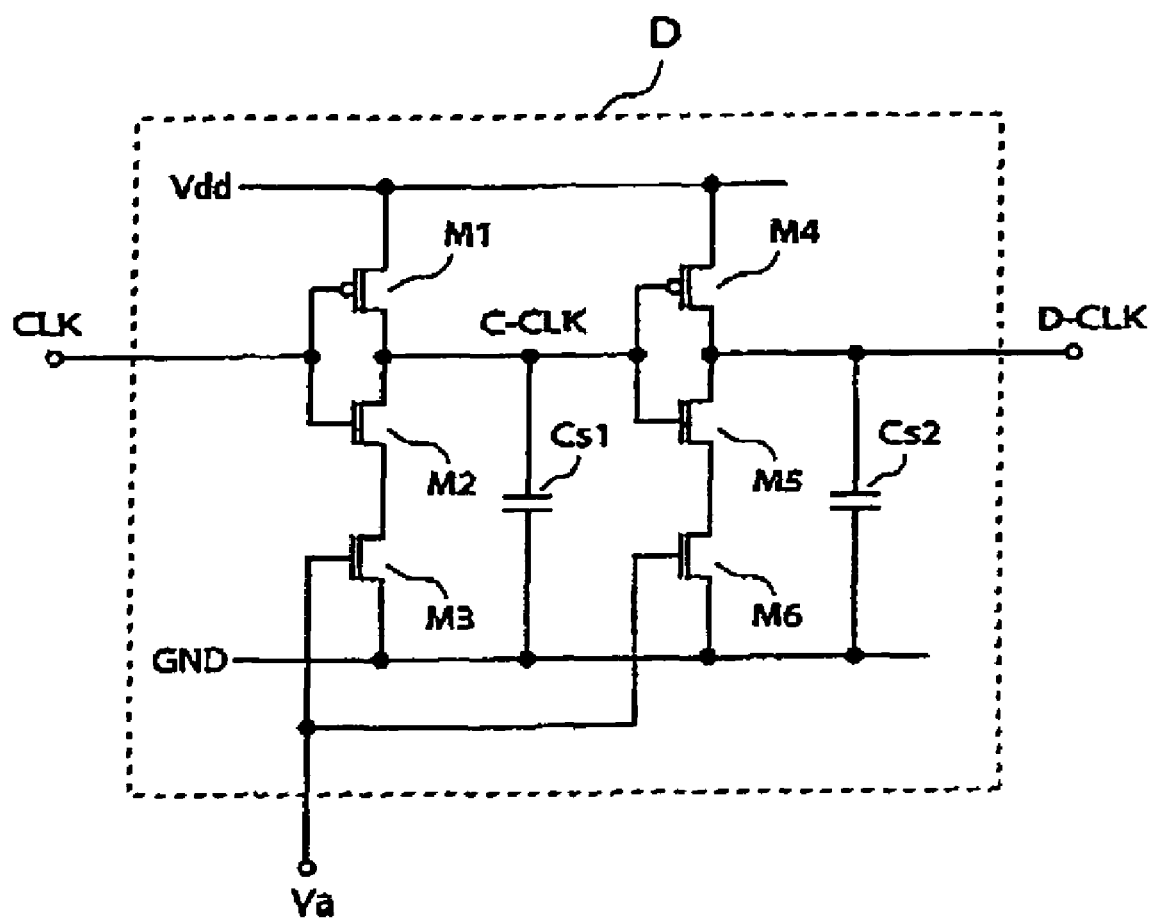
FIG. 4 is a circuit diagram showing a delay circuit in operation.
Figure 5:
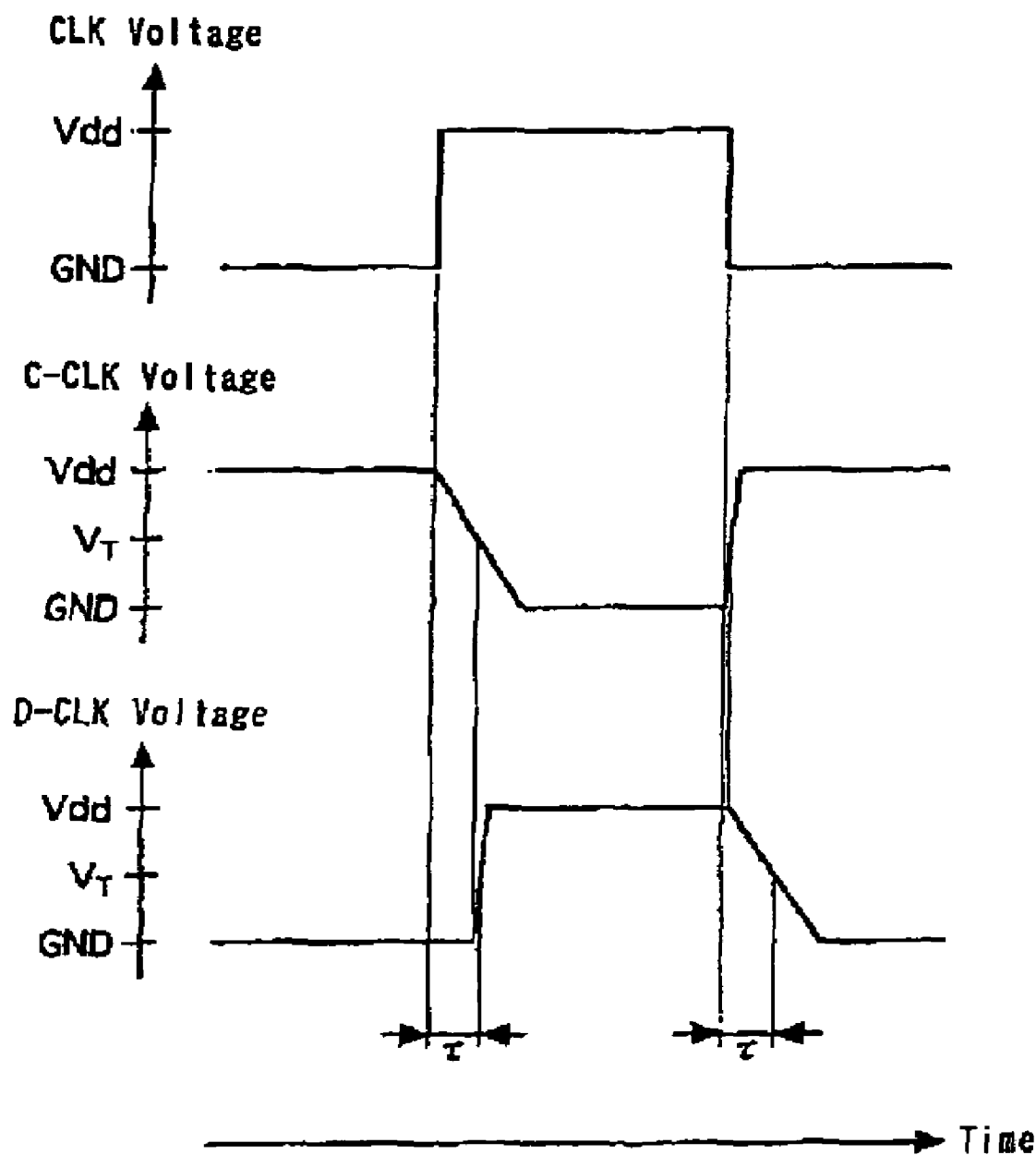
FIG. 5 is a circuit diagram showing an operating waveform of a delay circuit.

A stray capacitance, an input capacitance of FET, or the like is present in the delay circuit D of FIG. 2. FIG. 4 shows a delay circuit in which the sums of the stray capacitance, FET input capacitance and the like, which are denoted as Cs1 and Cs2, are additionally illustrated in the circuit of FIG. 2. In FIG. 4, the same elements as in FIG. 2 are given the same reference symbols as in FIG. 3. Also, FIG. 5 shows the operating wave-form of the delay circuit D where a rectangular wave-form is applied as the clock signal input CLK. Time delay generates by the above Cs1 and Cs2 as follows.

In a relation between the voltage of digital and the logic, using the logic threshold voltage VT as described later, logic is "0" from voltage 0 to voltage VT, while logic is "1" from the voltage VT to the voltage Vdd. Here, the logic threshold voltage VT is a voltage determined depending on the characteristics of a circuit, and is roughly ½ of Vdd.

In the delay adjustment voltage Va in FIG. 4, it is assumed that a constant voltage is set, which is higher than the threshold voltage of FET, M3 and M6, and lower than Vdd. Incidentally, in the initial state, the logic input CLK is assumed to be 0, and the voltage is assumed to be 0(GND electric potential). At this moment, FET M1 is ON, M2 is OFF, and the voltage of the signal C-CLK is Vdd (logic "1"). Further, FET M4 is Off, FET M5 is ON, the voltage of the clock signal output D-CLK is 0 V, and the logic is "0". The voltage of Cs1 is equal to that of the voltage of C-CLK, which is Vdd; and the voltage of Cs2 is equal to that of the voltage of the clock output D-DLK, which is 0 V.

When the logic of clock signal changes from "0" to "1", FET M1 comes to be OFF, and M2 comes to be ON. FET M3 shows current/voltage characteristics of FIG. 3 above-mentioned in the delay adjustment voltage Va. The voltage of Cs1 which is Vdd discharges through M3 and M2, and comes to be equal to or less than the logic threshold voltage VT after a delay of the time determined depending on the current value above-mentioned in the current/voltage characteristics of FIG. 3. In other words, after a delay of a certain time (τA), the voltage of the signal C-CLK comes to be not greater than VT. At the moment FET M4 changes to ON, and FET M5 changes to OFF, and through M4 Cs2 is quickly charged by the voltage Vdd (time τB). Thus the clock output D-CLK rises after a certain time of τA+τB from the point of time when the clock input CLK rises (the logic changes "0" to "1")

When the logic of the clock signal input changes "1" to "0", FET M1 comes to be ON, FET M2 comes to be OFF, and through M1 Cs1 is quickly charged by the voltage Vdd. At this moment because FET M4 changes to OFF, FET M6 has the current/voltage characteristics of FIG. 3 above-mentioned at the delayed adjustment voltage Va, through M5, M6, the voltage of Cs2 discharges, and comes to be not greater than the logic threshold after a delay of the time predicted at the current value above-mentioned in the current/voltage characteristics of FIG. 3. In other words, the voltage of the signal D-DLK comes to be equal to or less than VT after a delay of a certain time (τA). Thus, according to the above-described operations, the clock output D-CLK falls after a certain time of τA+τB from the point of time when the clock input CLK falls (the logic changes "1" to "0").

In this way, the clock input CLK input into the delay circuit comes to be the clock output after the delay time τA+τB; where the sum of τA and τB mentioned above is the delay time τ.

As the drain current ID of M3 or M6 is adjustable by the delay adjustable voltage Va equivalent to the voltage VGS as shown in FIG. 3, the adjustment of the delay time τ is possible by the delay adjustment voltage Va. In addition, although an explanation is given here using the signal voltage of the rectangular waveform as an example, similar operations can be obtained even using a trapezoid wave.

Figure 6:
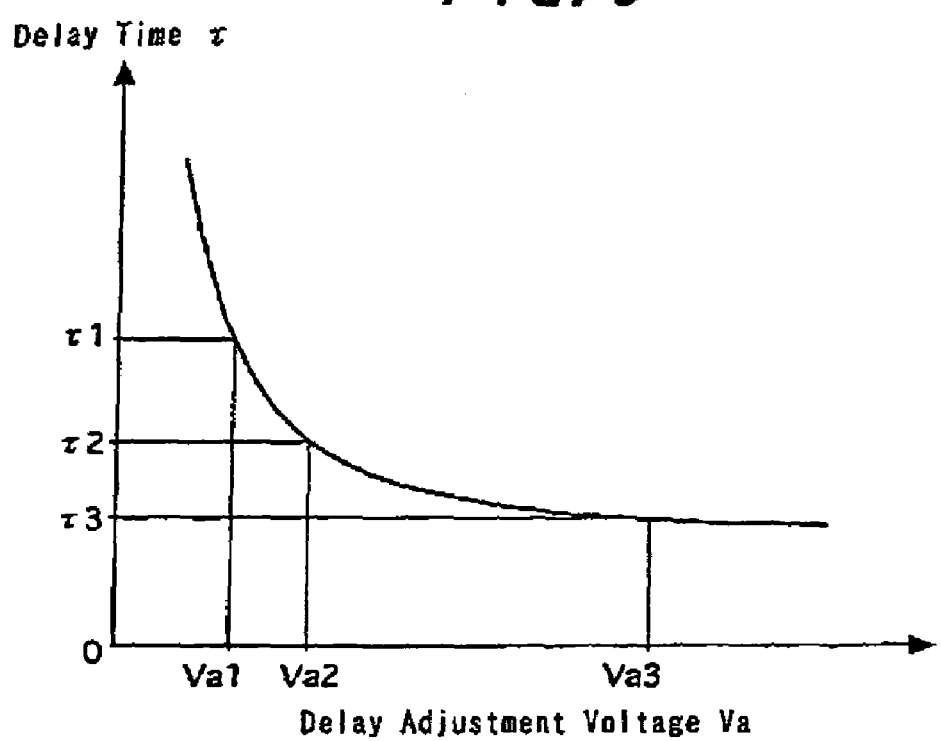
FIG. 6 is an explanatory view showing the characteristics of delay time for a delay adjustment voltage of a delay circuit.

The characteristics of the delay time τ (delay characteristics) for the delay adjustment voltage Va of the delay circuit is illustrated in FIG. 6. As the delay adjustment voltage Va decreases, the delay time τ increases nonlinearly as shown in FIG. 6. There are however upper and lower limits in the delay adjustment voltage Va on the basis of the characteristics of elements in a circuit.

Next, the environment dependency of these delay characteristics is examined. These delay characteristics are influenced by environments such as an ambient temperature Ta, a power supply voltage Vdd, and the like. For example, the delay time increases as Ta increases, and τ decreases as the power supply voltage increases. When a range for operating temperature is set between −10° C. and 80° C., the degree of the variation in the delay time τ is about 1.5 times.

Figure 7:
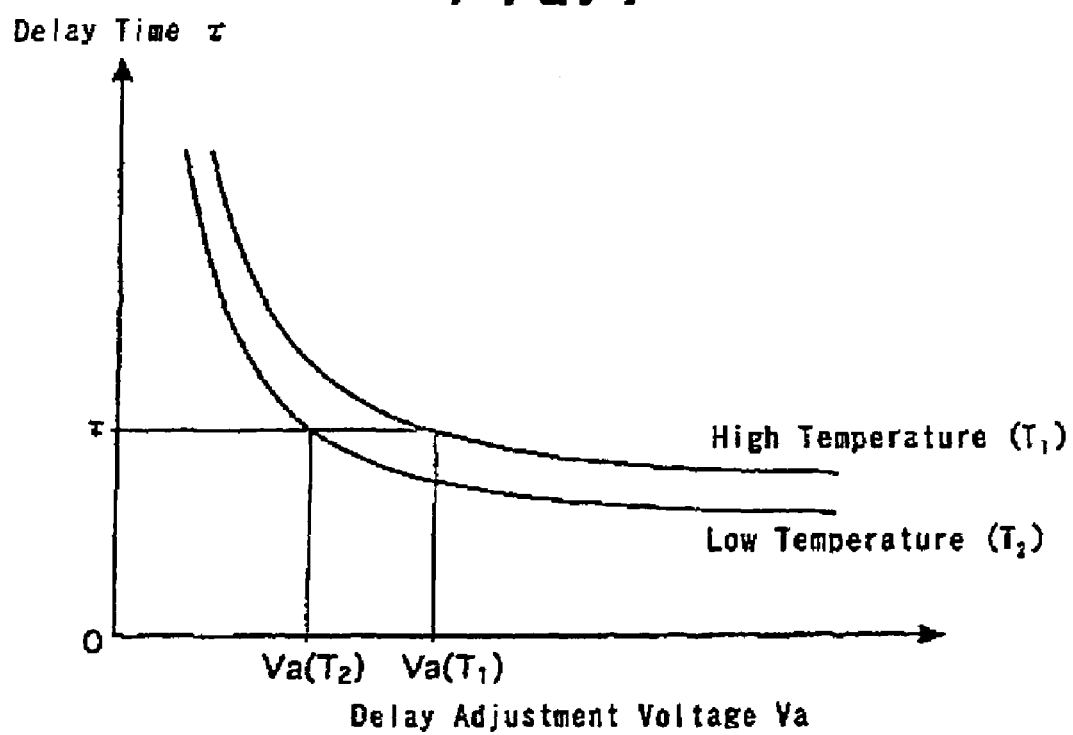
FIG. 7 is an explanatory view showing the characteristics of the delay time of the delay circuit where a temperature varies.
Figure 8:
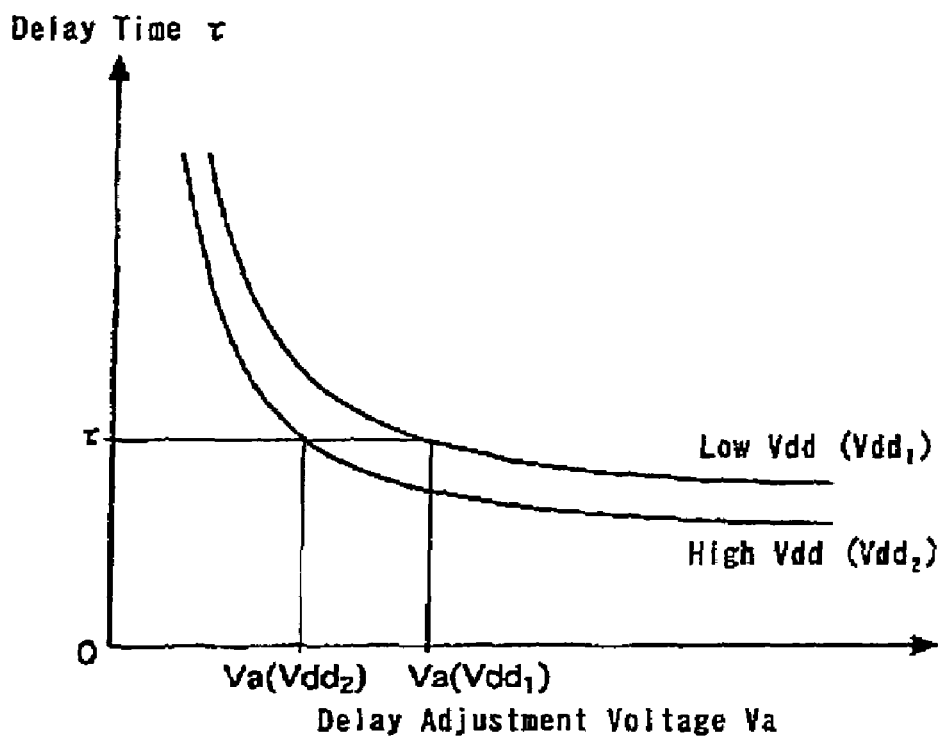
FIG. 8 is an explanatory view showing the characteristics of the delay time of the delay circuit where a current voltage varies.

Hence, there is necessity to correct the delay adjustment voltage Va according to the characteristics in FIG. 7 and FIG. 8 for maintaining the given τ, when the ambient temperature or supply voltage changes. This can be achieved by use of the configuration shown in FIG. 1 of the present invention, and a corrected delay adjustment voltage Va is generated. In other words, the delay adjustment reference voltage, which consistently keep delay time τ constant for the variation of the environment, is generated. The delay adjustment voltage generating in this synchronizing loop circuit is called the delay adjustment reference voltage.

Figure 9:
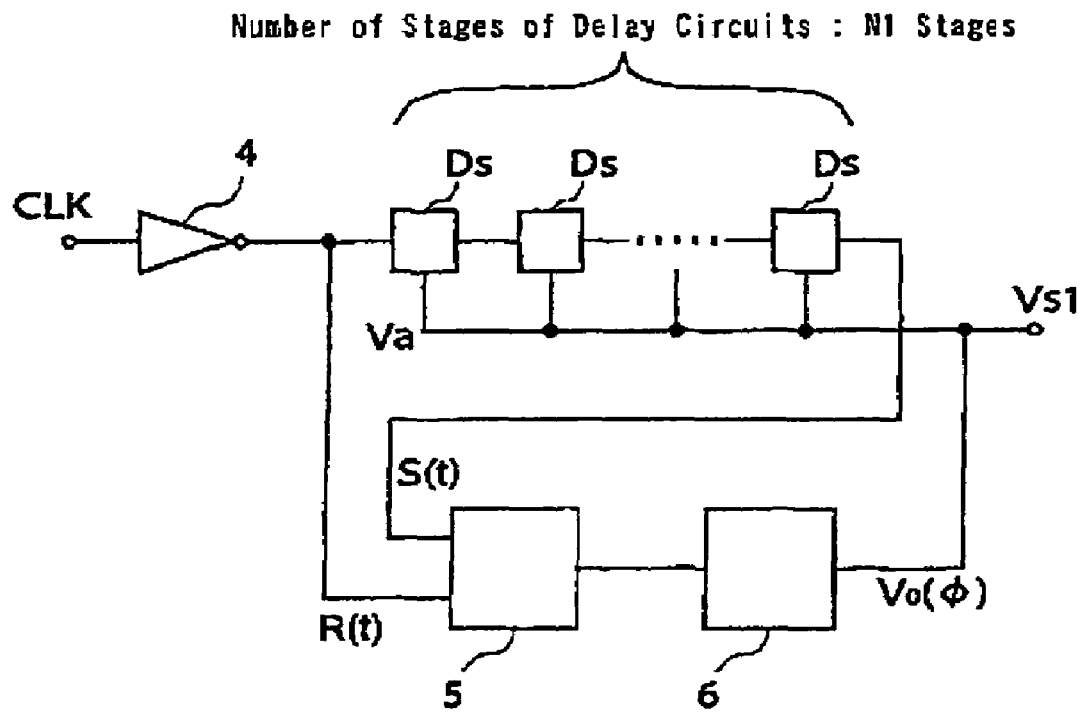
FIG. 9 is a view showing an implementation example of a delay synchronizing loop circuit.
Figure 10:
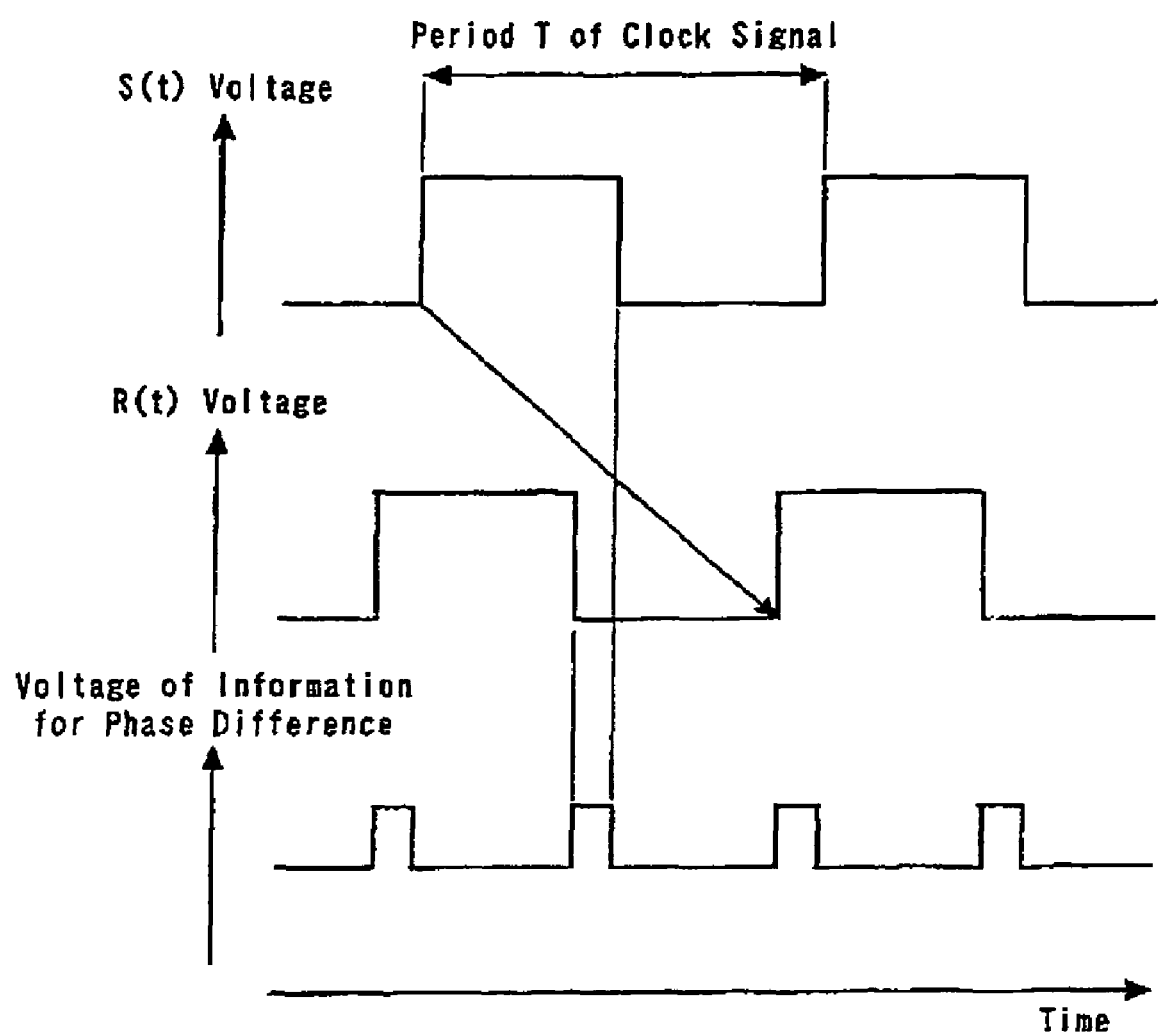
FIG. 10 is a schematic showing an operating waveform of a phase comparator.

Taking up DLL 1 as a representative of the delay synchronizing loop circuit, the operation is explained using FIG. 9 and FIG. 10. An implementation example of the delay synchronizing loop circuit DLL is shown in FIG. 9.

In FIG. 9, CLK is clock input, 4 is an inverter which is an input buffer of the CLK, Ds is the delay circuit, 5 is a phase comparator, and 6 is a loop-filter. The delay circuit of the same configuration as the mentioned above delay circuit D consists of N1. These are connected in N1 stage series. Here, the delay adjustment Va is a common one. The clock signal of output of the inverter 4 is input into the first stage of the circuits in N1 stage series. The output of the phase comparator 5 becomes the output of the adjustment voltage Va for all of the delay circuits of N1 via a loop-filter 6.

If the delay circuit Ds of N1 stages are formed in the same IC chip, the delay adjustment voltage characteristics becomes uniform. And so if the same voltage Vs1 is provided as the delay adjustment voltage Va1, the delay time of each delay circuit is regarded as the same. Thus if the delay time of the delay circuit in FIG. 9 is τ, the output signal of the delay signal of N1 stages is delayed as much as τ×N1 in comparison with the original input signal. And also, the output signal is provided to the phase comparator 5 in the same way.

The configuration of the operating waveform of the phase comparator 5 in FIG. 9 is schematically illustrated in FIG. 10. In FIG. 10, the phases of a reference signal R(t) and a signal S(t) delayed by the delay circuits of N1 stages are compared with a phase comparator 5, the information of phase difference is output. This signal is smoothed by the loop-filter 6 in the next stage, and an unnecessary high-frequency signal is subject to attenuation, and it becomes a direct-current voltage Vo(φ) proportional to the phase difference φ between the signal R(t) and the signal S(t). This voltage Vo(φ) is output as the delay adjustment voltage Va and the delay adjustment reference voltage Vs1 for the delay circuit D.

Performing negative feedback, this delay synchronizing loop circuit do the control action as S(t) goes over R (t). By this action, the delay time τ is automatically controlled corresponding to a cycle T of the clock signal pulse, and S(t) goes over R(t), and the control action is stabilized.

Thus the direct-current which smoothed Vo when the phase difference is φ=2π, comes to be the stabilized delay adjustment reference voltage Vs1. The delay time τ per one stage comes to be τ1=T/N1, because the delay circuits Dss of N1 stages are cascaded. Here T is the cycle of CLK.

Figure 11:
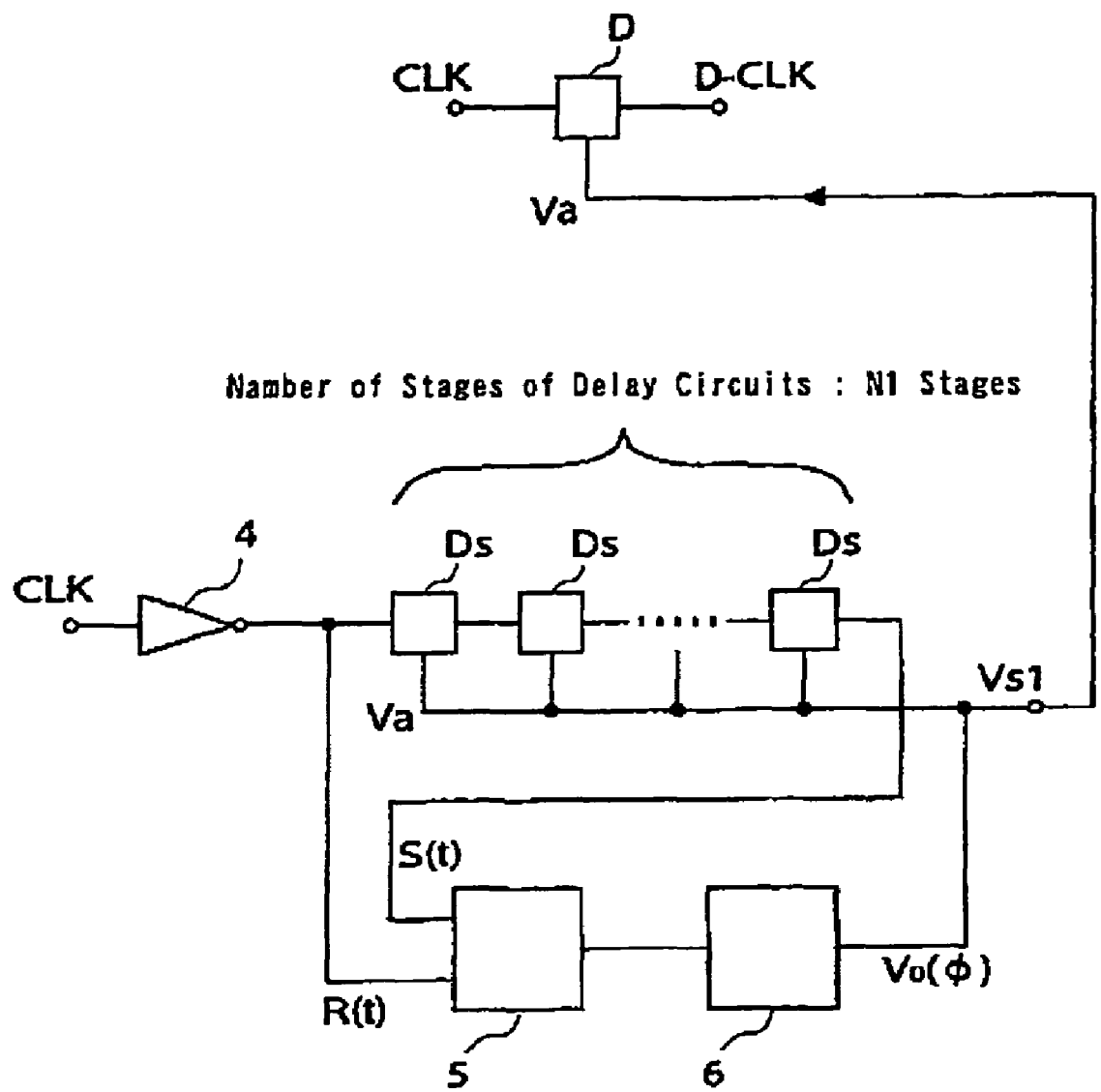
FIG. 11 is an explanatory view for a principle where a delay time is retained constant by using a delay adjustment reference voltage.

Furthermore, in a circuit which is a delay circuit D arranged outside of the delay synchronizing loop circuit DLL1 in FIG. 9, and which is formed on the same chip as the delay circuit Ds, with similar characteristics as the delay circuit Ds, the delay circuits D and Ds have the same delay time τ when Vs1 is input for Va input. (FIG. 11)

In other words, where the delay time adjustment voltage is input into another delay circuit D of the same configuration, the delay time which is obtained in another circuit D can be constant value regardless of the variation of the environment. While the characteristics of the delay circuit change by the variation of the operating environment, the delay adjustment voltage Va and the delay adjustment reference voltage Vs1 vary as keeping the delay time τ.

As this negative feedback control system deal with the digital signal, the phase comparator 5 may consist of EX-OR (Exclusive-OR) phase comparator or R-S (Reset-Set) flip-flop. Further more, loop-filter 6 may consist of the lag-lead low pass filter to allow for the operating margin.

In this application, a plurality of the delay adjustment reference voltage is generated using a plurality of delay synchronizing loop, because it is necessary to vary the adjustment voltage Va according to τ in order to make the delay time τ of the delay circuit D variable.

Although the above-mentioned DLL1 do the same operation as the delay amount control circuit DLL2 or DLL3 in FIG. 1, the stage of the delay circuit differs. When each of the delay time of the control circuit DLL2, DLL3 is τ2, τ3, and each of the stage of the delay circuit is N2, N3, the delay time τ2, τ3 is T/N2, T/N3 as well.

In the configuration using the delay synchronizing loop, the delay adjustment voltage Va as above-mentioned comes to be taken as many as the number of the circuit of the delay synchronizing loop. However In this application, the method for generating the delay adjustment voltage are added, because it is necessary to generate a large variety of adjustment voltage for configuring the delay time a little by little. In other words, the delay adjustment voltage Va according to a whole adjustment value input Ba is generated.

It is preferable that the delay time varies in linear for the adjustment value input Ba. The delay adjustment voltage Va for the adjustment value input Ba on varying in linear is computable from the characteristics of FIG. 6, and is exemplified on the curve of FIG. 12. This application is characterized by using a piece-wise linear approximation to generate the voltage similar to the delay adjustment voltage described in this curve.

At this point, to make it easy to explain, the stage of the delay circuit Ds on the delay synchronizing loop circuit, N1, N2, N3, shall be N1<N2<N3. According to τ-Va characteristics in FIG. 6, τ1=T/N1 is defined by a value (Vs1) where the delay adjustment voltage Va is close to the minimum value (Va_min), while τ3=T/N3 is defined by a value (Vs3) where the delay adjustment voltage Va is close to the maximum value (Va_max). And also τ2=T/N2 is a value defined by an appropriate voltage Vs2 between Vs1 and Vs3. Voltages Vs1, Vs2, and Vs3 are those at three points on the Va characteristic curve in FIG. 6, and define the points of operation, P1(Vs1, τ1), P2(Vs2, τ2), and P3(Vs3, τ3).

Figure 13:
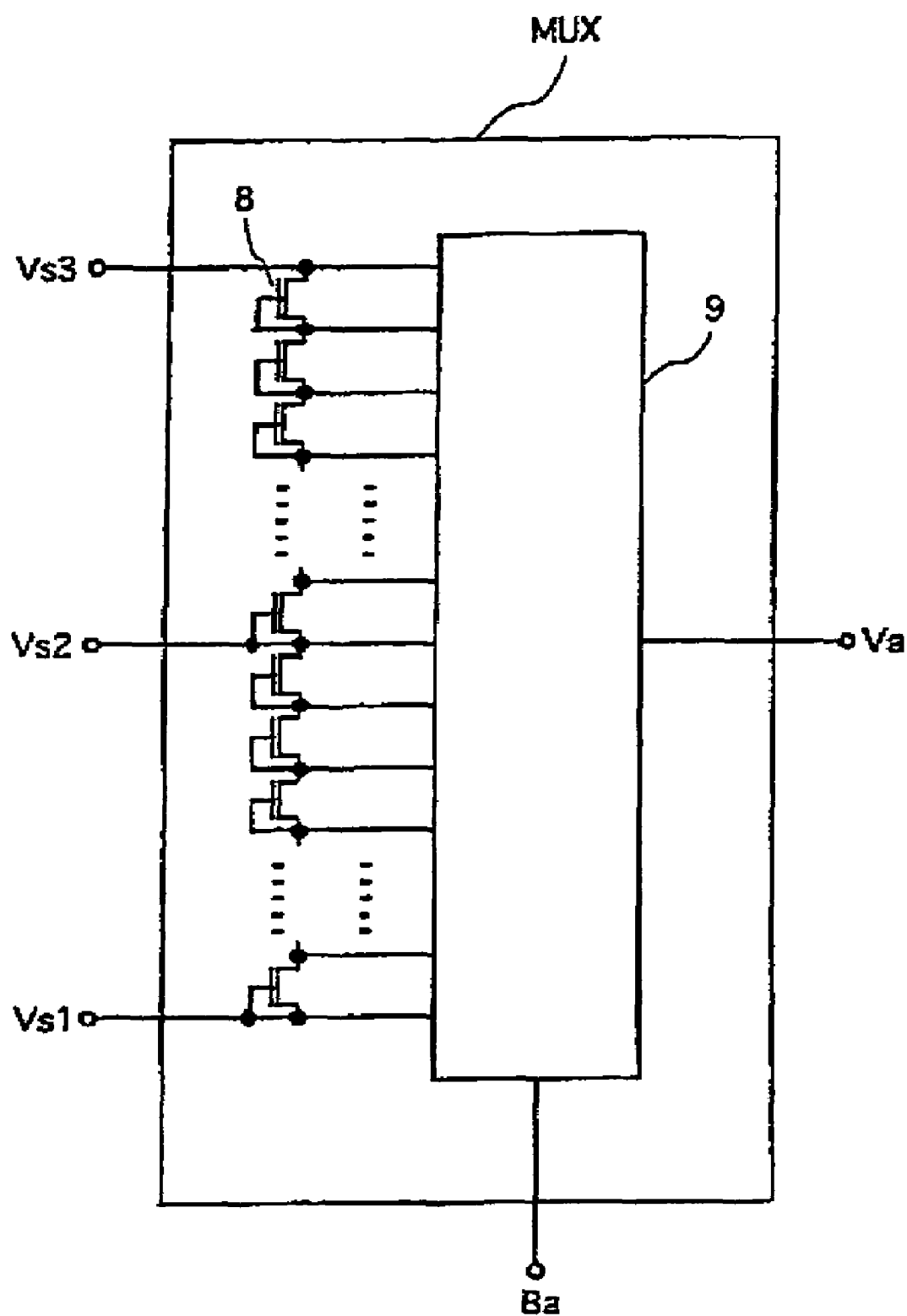
FIG. 13 is a configuration example of a generating circuit for a delay adjustment voltage of a first embodiment.

For a configuration example for a delay adjustment voltage generating circuit, the case that the adjustment value Ba is 4 bit (b3 b2 b1 b0), that is, Ba=0 to 15, is considered for an explanation thereof with reference to FIG. 13. In FIG. 13, MUX is the same delay adjustment voltage generating circuit. Reference numeral 8 is a depletion type FET, 9 is an analog multiplexer. And FET operates as a resistor, and fifteen thereof are connected in series.

Three adjustment reference voltages Vs1, Vs2, and Vs3 are input into the delay adjustment voltage generating circuit MUX. Here, Vs3 is a maximum delay adjustment voltage, and Vs1 is a minimum delay adjustment voltage. Vs2 is a voltage between Vs1 and Vs3. The voltage range between Vs1 and Vs3 is divided into 15 voltages by FET 8. The delay adjustment voltage Va is selected based on the information of the adjustment input Ba by analog multiplexer 9.

The operation of the delay adjustment voltage generating circuit MUX in FIG. 13 generates a delay adjustment voltage Va for an adjustment value Ba from a voltage which is linearly interpolated for the adjustment input value Ba between the adjustment reference voltages Vs1 and Vs2, and from a voltage which is linearly interpolated between the delay adjustment reference voltages Vs2 and Vs3. This delay adjustment voltage Va is approximated using a piece-wise linear approximation as shown in lines 22, 23 of FIG. 12. The adjustment value input Ba according to P1 is 0 (0000 in binary notation), the adjustment value is 15 (1111 in binary notation), and the adjustment value input Ba according to P2 is an optional integer number between 0 and 15.

Figure 14:
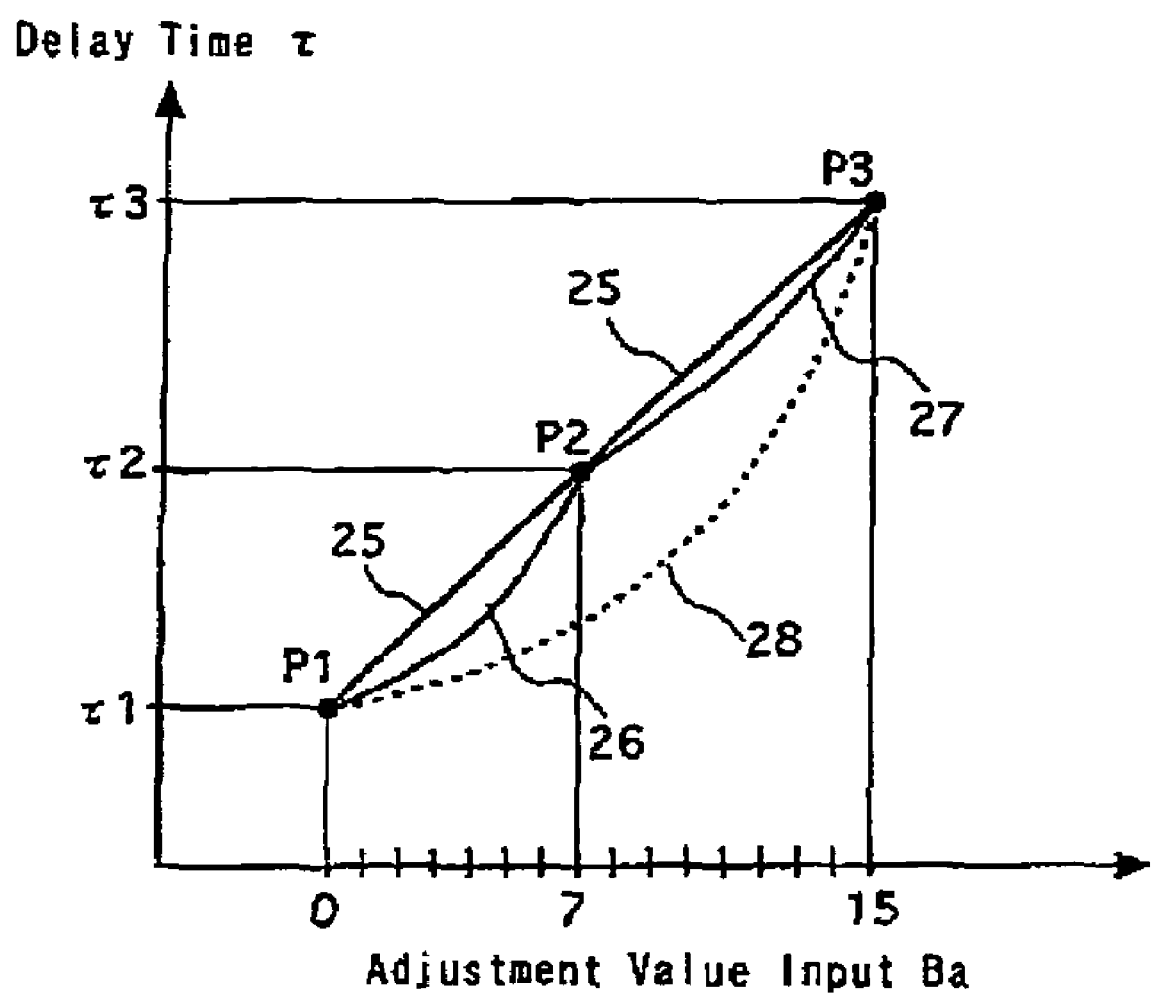
FIG. 14 is an explanatory view showing a relationship between the adjusted value input and the delay time.

FIG. 14 is the characteristics of the delay time τ-adjustment value input Ba which is calculated based on the characteristics of τ-Va in FIG. 6, that is, the characteristics of the adjustment value input Ba (0 to 15). In FIG. 14, 25 is the characteristics for the curves 21, 26 and 27 are the characteristics according to the piece-wise linear approximation by the present invention, and 28 is the characteristic corresponding to a simple line approximation.

Thus, as described above, the adjustment voltage Va for each adjustment input value Ba is defined, which corresponds is based on the adjustment reference voltages Vs1 to Vs3.

Figure 15:
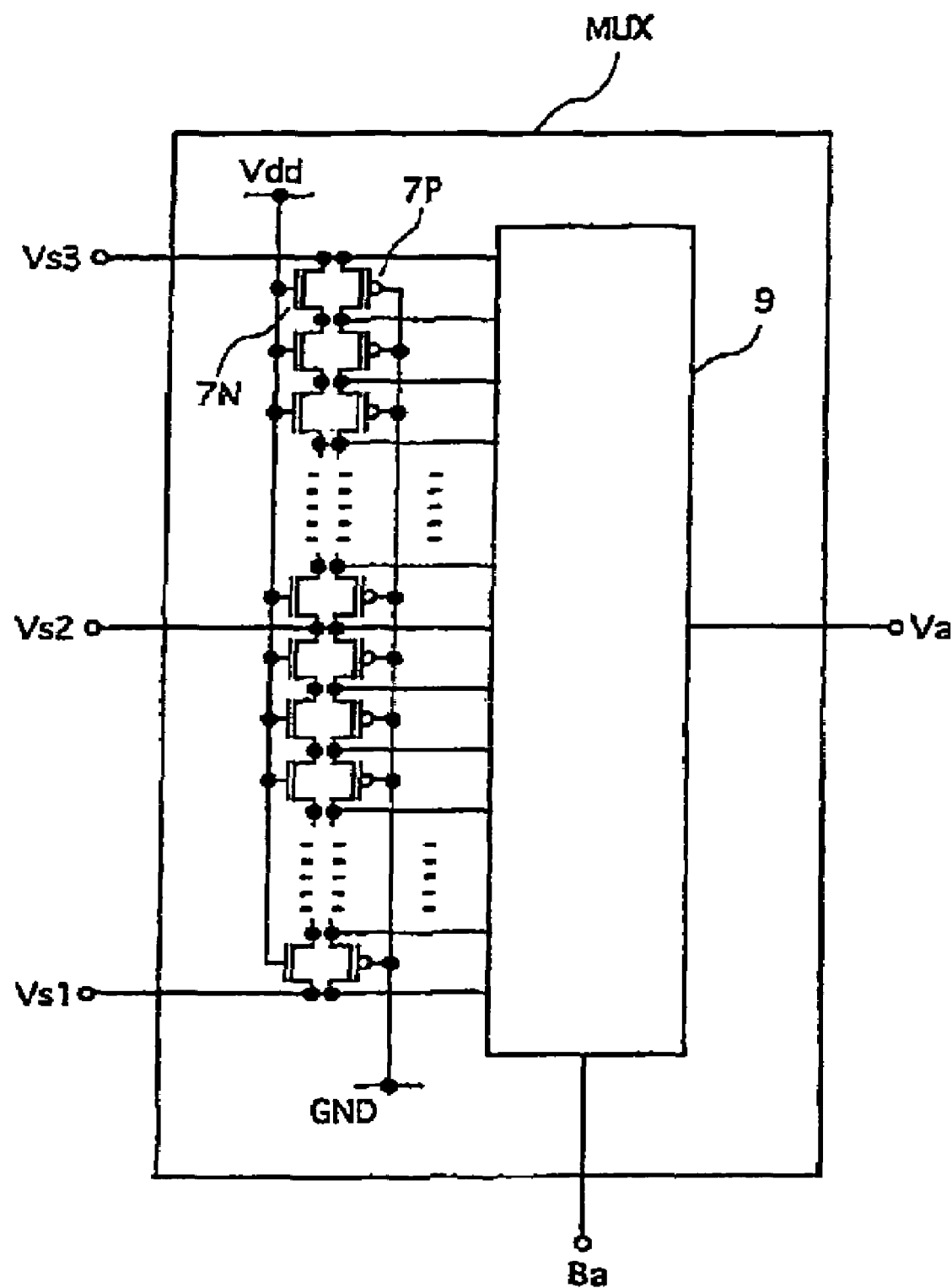
FIG. 15 is another configuration example of the generating circuit for a delay adjustment voltage of the first embodiment.

The delay adjustment voltage generating circuit MUX of FIG. 13 uses a depletion type FET as FET 8, but can be configured by enhancement type FET. The circuit of the delay adjustment voltage generating circuit in this case is shown in FIG. 15. In FIG. 15, 7N is an N channel FET, 7P is a P channel FET, and gate electrodes are respectively connected to Vdd and GND. Other symbols designate the same components as those in FIG. 13.

As described above, in the first embodiment, it is made possible to realize a delay circuit with a small circuit area, which has approximately linear delay τ for the adjustment input Ba and which is independent of an environment of a temperature and an electric power supply voltage.

Second Embodiment

Next, a second embodiment is described.

Figure 16:
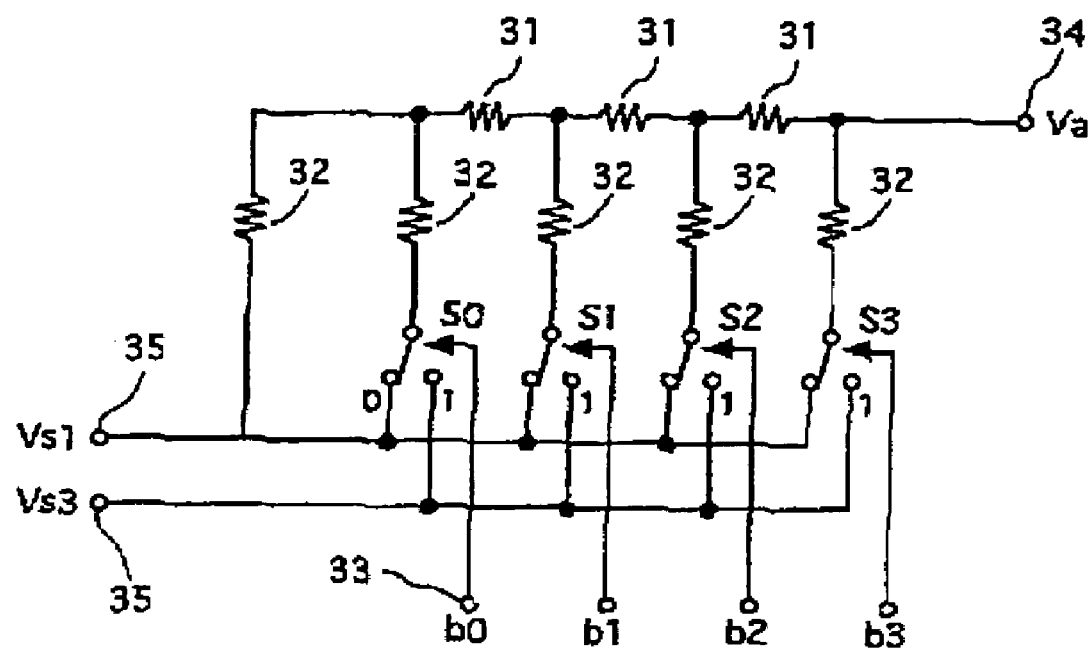
FIG. 16 is a principle explanatory view showing a configuration example of a delay adjustment voltage of a second embodiment.

In the first embodiment, it is also possible to obtain another method for generating a delay adjustment voltage. In FIG. 16, a configuration of the delay adjustment voltage generating circuit according to another method is shown. This is the method of the delay adjustment voltage generator by R-2R type D-A converter. In FIG. 16, S0 to S3 are switches, 31 is a resistor whose resistance is R, 32 is a resistor whose resistance is 2R, 33 is a terminal into which an adjustment value input Ba is input, 34 is a terminal from which a delay adjustment voltage Va is output, and 35 is a terminal into which an adjustment reference voltage is input. Each of b0 to b3 stands for a bit of the adjustment value input Ba.

In the delay adjustment voltage generating circuit MUX in FIG. 16, the voltage comes out at the terminal 34, which is divided from potential difference $V_{s1}-V_{s3}$ corresponding to the condition of the switches S0 to S3 (Ba: 16 patterns of 0 to 15). Switches, S0 to S3 are switched ON and OFF corresponding to b0 to b3. This circuit is a ladder type circuit of R-2R, and the relation between Ba and output Va is calculated shown in Table 1.

TABLE 1

| Adjustment Value | Binary Digit Form | | | | Delay Adjustment |
|---|---|---|---|---|---|
| Input Ba | b3 | b2 | b1 | b0 | Voltage Va |
| 0 | 0 | 0 | 0 | 0 | $V_{s3}$ |
| 1 | 0 | 0 | 0 | 1 | $(15V_{s3} + V_{s1})/16$ |
| 2 | 0 | 0 | 1 | 0 | $(14V_{s3} + 2V_{s1})/16$ |
| 3 | 0 | 0 | 1 | 1 | $(13V_{s3} + 3V_{s1})/16$ |
| 4 | 0 | 1 | 0 | 0 | $(12V_{s3} + 4V_{s1})/16$ |
| 5 | 0 | 1 | 0 | 1 | $(11V_{s3} + 5V_{s1})/16$ |
| 6 | 0 | 1 | 1 | 0 | $(10V_{s3} + 6V_{s1})/16$ |
| 7 | 0 | 1 | 1 | 1 | $(9V_{s3} + 7V_{s1})/16$ |
| 8 | 1 | 0 | 0 | 0 | $(8V_{s3} + 8V_{s1})/16$ |
| 9 | 1 | 0 | 0 | 1 | $(7V_{s3} + 9V_{s1})/16$ |
| 10 | 1 | 0 | 1 | 0 | $(6V_{s3} + 10V_{s1})/16$ |
| 11 | 1 | 0 | 1 | 1 | $(5V_{s3} + 11V_{s1})/16$ |
| 12 | 1 | 1 | 0 | 0 | $(4V_{s3} + 12V_{s1})/16$ |
| 13 | 1 | 1 | 0 | 1 | $(3V_{s3} + 13V_{s1})/16$ |
| 14 | 1 | 1 | 1 | 0 | $(2V_{s3} + 14V_{s1})/16$ |
| 15 | 1 | 1 | 1 | 1 | $(V_{s3} + 15V_{s1})/16$ |

Relation Between Adjustment Value and Output by R-2R Type Converter

Figure 12:
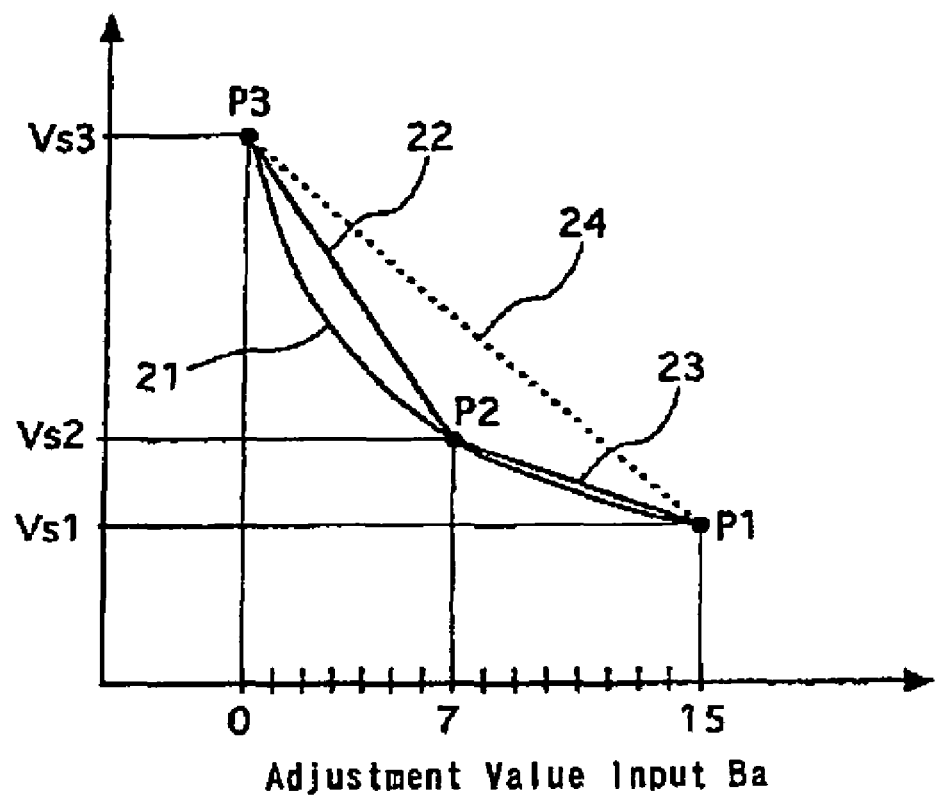
FIG. 12 is an explanatory view showing the characteristics of a delay adjustment voltage for an adjusted value input.

This Table 1 is for the case where there is no intermediate voltage Vs2 in FIG. 12, and where is illustrated by line 24 of collinear approximation. Ba=0 corresponds to VS1, and Ba=15 corresponds to Vs3.

The delay adjustment voltage generating circuit MUX in FIG. 16 is also capable to configure the resistor 31, 32 and the switch S0~S3 by FET. This case allows small chip area by using FETs, which are easily fabricated in LSI.

Figure 17:
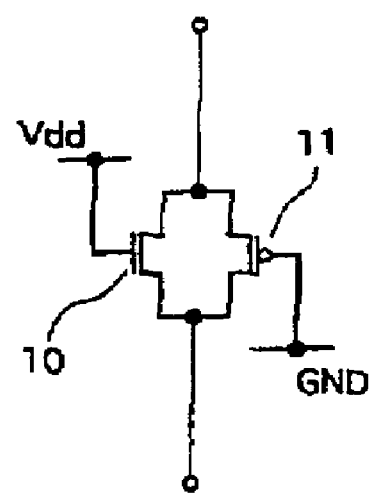
FIG. 17 is a circuit diagram showing an example where a resistor of a generating circuit for a delay adjustment voltage is formed of FET.

The example to configure the resistor in FIG. 16 by FET is illustrated in FIG. 17. In FIG. 17, 10 is N channel FET, and 11 is P channel FET. The gate of FET 11 is connected to Vdd, and the gate of FET 10 is connected to GND. FET 10 and FET 11 are connected in parallel. The resistor between source and drain connected in parallel comes to be the above-mentioned value by making optimal design of the dimension or configuration of FET 10 or 11. In the same way, the resistor 32 in FIG. 32 is also capable to configure by FET.

Figure 18:
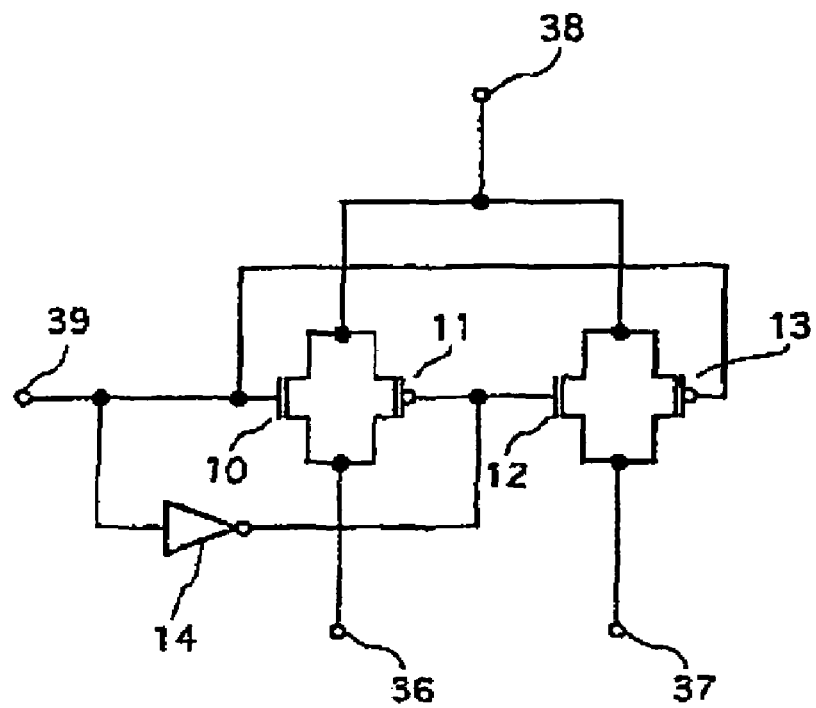
FIG. 18 is a circuit diagram showing an example where a resistor and a switch of a generating circuit for a delay adjustment voltage are formed of FET.

And also, FIG. 18 shows the example configuring the series circuit of the resistor 32 and switch S0 in FIG. 16 by PET. In FIGS. 18, 10 and 12 are N channel FETs, 11 and 13 are P channel FETs, 14 is an inverter, 36 and 37 are terminals selected by switch, 38 is a common terminal, 39 is an input terminal of switching control.

Figure 19:
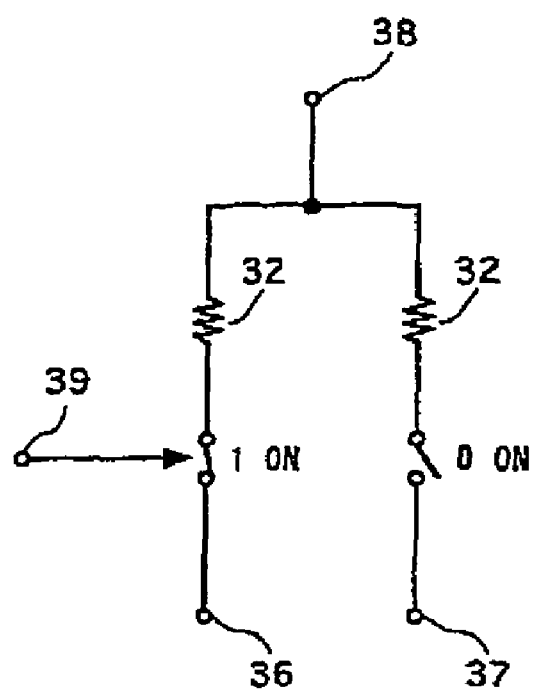
FIG. 19 is an equivalent circuit diagram showing an example where a resistor and a switch of a generating circuit for a delay adjustment voltage are formed of FET.
Figure 20:
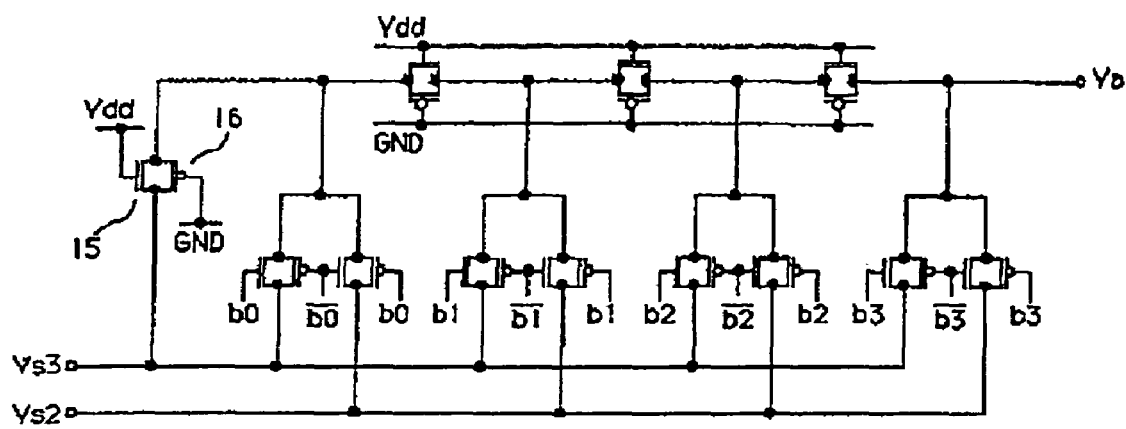
FIG. 20 is a circuit explanatory view showing a configuration example of a generating circuit for a delay adjustment voltage of the second embodiment.

The signal from terminal 39 is directly connected to the gate of FET 10 and FET 13, and the signal through the inverter connects to the gate of FET 11 and FET 12. Each of sources and drains of FET 10 and FET 11 connects in parallel. Where signal at 39 is "1", that is, the voltage of Vdd, FET 10 and FET 11 conduct at the above-mentioned resistor value, and FET 12 and FET 13 are OFF. In the case of the signal input is "0", that is, the voltage of GND, FET 10 and FET 11 are OFF, and FET 12 and FET 13 conduct at the above-mentioned value. The resistor between source and drain in parallel comes to be an above-mentioned value by making optimal design of the dimension and configuration of FET 10 to 13. The equivalent circuit of the circuit of FIG. 18 is shown in FIG. 19.

By the circuit in FIG. 18, it is enable to configure the circuit of the resistor 32 and the switch S1 in FIG. 16, the circuit of the resistor 32 and the switch S2, and the circuit of the resistor 32 and the switch S3. In the case of this configuration, the resistor achieved by FET having a voltage-dependence makes small deviation for the relation between the adjust input Ba and the delay adjustment voltage Va. For this reason an evolvable algorithm is particularly preferable to adjust the digital circuit system which the delay adjustment circuit system of this application invention is implemented on.

Third Embodiment

Next, a third embodiment is described.

The third embodiment configures the delay adjustment voltage generating circuit MUX in FIG. 13 according to the first embodiment with two pairs of R-2R ladder circuits. This embodiment can realize the Va-Ba characteristics using the piece-wise linear approximation with two straight lines as in the first embodiment by using a smaller chip area than that in the first embodiment.

Figure 21:
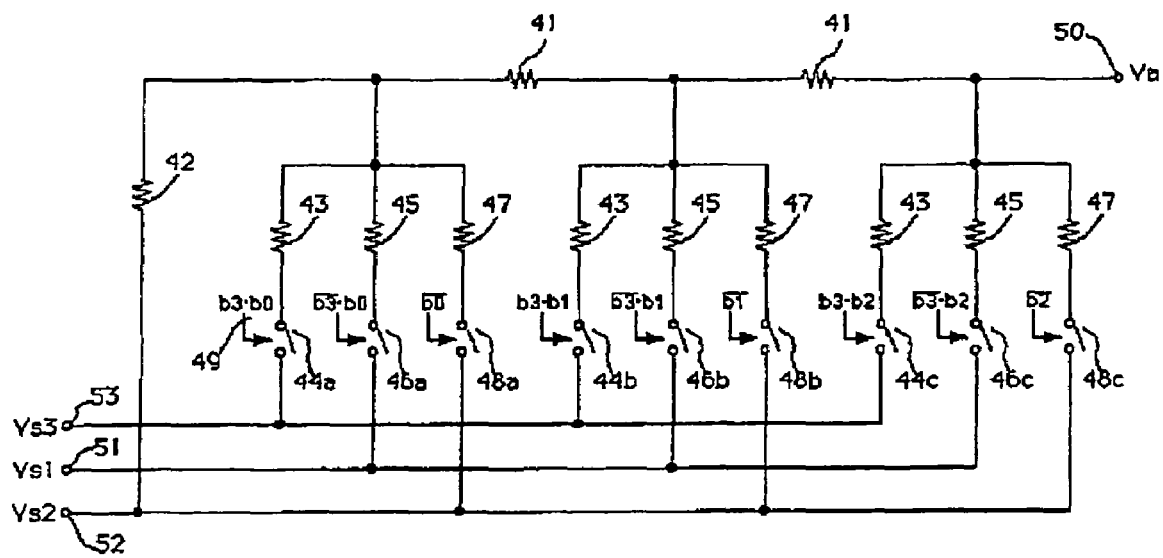
FIG. 21 is a view showing a constituting principle of a generating circuit for a delay adjustment voltage of a third embodiment.

FIG. 21 shows the constituting principle of the delay adjustment generating circuit MUX. In FIG. 21, reference numeral 41 is a resistor with resistance value of R; 42, 43, 45 and 47 are respectively resistors with resistance values of 2R; 44a, 44b, 44c, 46a, 46b, 46c, 48a and 48c are switches, 49 is a terminal to which the adjustment value input Ba is input, 50 is a terminal from which the delay adjustment voltage Va is output; and each of 51, 52 and 53 is a terminal to which the delay adjustment reference voltage is input.

TABLE 2

| Adjustment Value | Binary Digit Form | | | | Delay Adjustment |
|---|---|---|---|---|---|
| Input Ba | b3 | b2 | b1 | b0 | Voltage Va |
| 1 | 0 | 1 | 1 | 1 | $(7V_{s3} + V_{s2})/8$ |
| 2 | 0 | 1 | 1 | 0 | $(6V_{s3} + 2V_{s2})/8$ |
| 3 | 0 | 1 | 0 | 1 | $(5V_{s3} + 3V_{s2})/8$ |
| 4 | 0 | 1 | 0 | 0 | $(4V_{s3} + 4V_{s2})/8$ |
| 5 | 0 | 0 | 1 | 1 | $(3V_{s3} + 5V_{s2})/8$ |
| 6 | 0 | 0 | 1 | 0 | $(2V_{s3} + 6V_{s2})/8$ |
| 7 | 0 | 0 | 0 | 1 | $(V_{s3} + 7V_{s2})/8$ |
| 8 | 0 | 0 | 0 | 0 | $V_{s2}$ |
| 8 | 1 | 0 | 0 | 0 | $V_{s2}$ |
| 9 | 1 | 0 | 0 | 1 | $(1V_{s1} + 7V_{s2})/8$ |
| 10 | 1 | 0 | 1 | 0 | $(2V_{s1} + 6V_{s2})/8$ |
| 11 | 1 | 0 | 1 | 1 | $(3V_{s1} + 5V_{s2})/8$ |
| 12 | 1 | 1 | 0 | 0 | $(4V_{s1} + 4V_{s2})/8$ |
| 13 | 1 | 1 | 0 | 1 | $(5V_{s1} + 3V_{s2})/8$ |
| 14 | 1 | 1 | 1 | 0 | $(6V_{s1} + 2V_{s2})/8$ |
| 15 | 1 | 1 | 1 | 1 | $(7V_{s1} + V_{s2})/8$ |

Each of b0 to b3 is indicative of a bit of the adjustment value Ba. The relation between Ba and b0 to b3 is shown in Table 2. As a matter of convenience, the inversion of a bit (the inversion of logic) is expressed by the symbol, "‾". Delay adjustment reference voltages Vs1, Vs2, Vs3 are input into the terminals 51, 52 and 53, respectively.

When the logic multiplication of b0 and b3 is 1, the switch 44a is turned ON, and OFF other than that. When the logic multiplication of b0 and b̄3 is 1, the switch 46a is turned ON, and OFF other than that. When b̄0 is 1, the switch 48a is turned ON, and OFF other than that.

When the logic multiplication of b1 and b3 is 1, the switch 44 is turned ON, and OFF other than that. When the logic multiplication of b1 and b̄3 is 1, the switch 46b is turned ON, and OFF other than that. When b̄1 is 1, the switch 48b is turned ON, and OFF other than that.

When the logic multiplication of b2 and b3 is 1, the switch 44c is turned ON, and OFF other than that. When the logic multiplication of b2 and b̄3 is 1, the switch 46c is turned ON, and OFF other than that. When b̄2 is 1, the switch 48c is turned ON, and OFF other than that.

Figure 22:
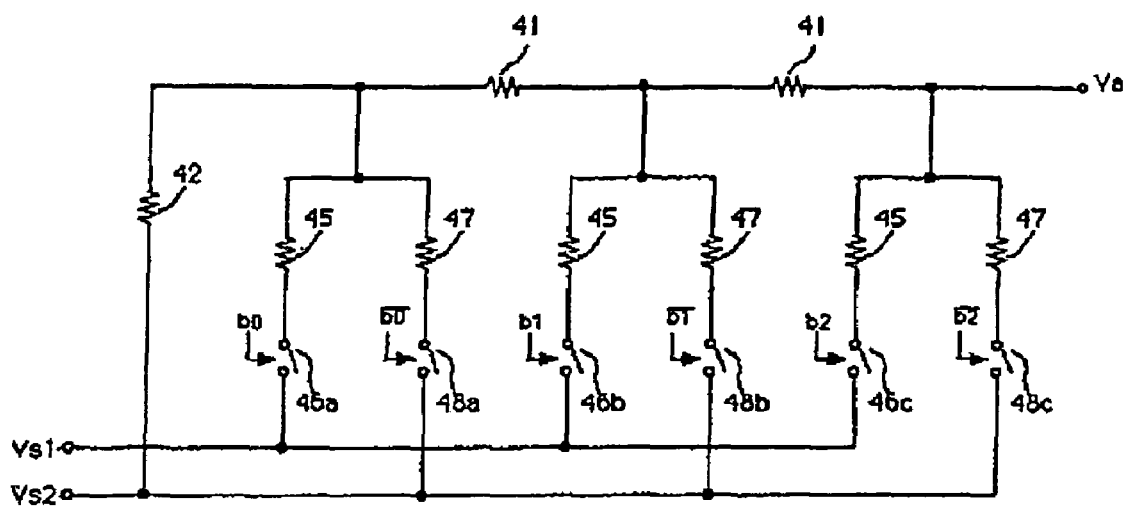
FIG. 22 is an equivalent circuit diagram showing a part of the generating circuit for a delay adjustment voltage of the third embodiment.

Incidentally, the circuit in FIG. 21 is equivalent to the equivalent circuit shown in FIG. 22, because when b3 is 0, all of the switches 44a, 44b and 44c are turned OFF. And also when b3 is 1, the circuit of FIG. 23 is equal to the equivalent circuit shown in FIG. 22, because as all of the switch 44a, 44b and 44c are OFF.

Figure 23:
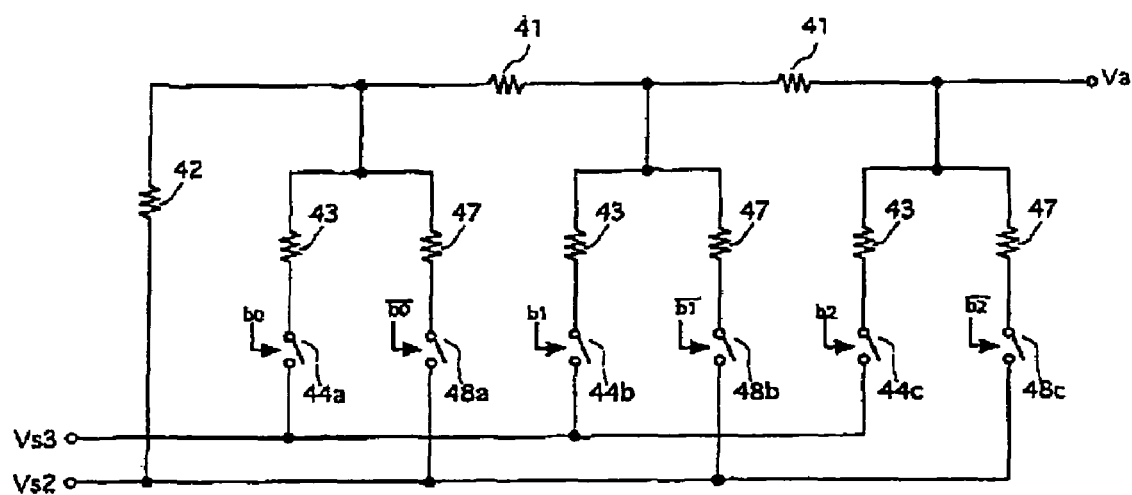
FIG. 23 is an equivalent circuit diagram showing another part of the generating circuit for a delay adjustment voltage of the third embodiment.

It is possible to divide into two equivalent circuits, because the circuits in FIG. 22 and FIG. 23 are not used electrically for the adjustment value setting at the same time. Each of the circuits in FIG. 22 and FIG. 23 is a R-2R ladder circuit of three bits.

In this way, two pairs of the R-2R ladder circuits of three bits are formed, which are equivalent to each other and which perform equivalently switching between a voltage generating range from Vs1 to Vs2 and a voltage generating range from Vs2 to Vs3.

Figure 24:
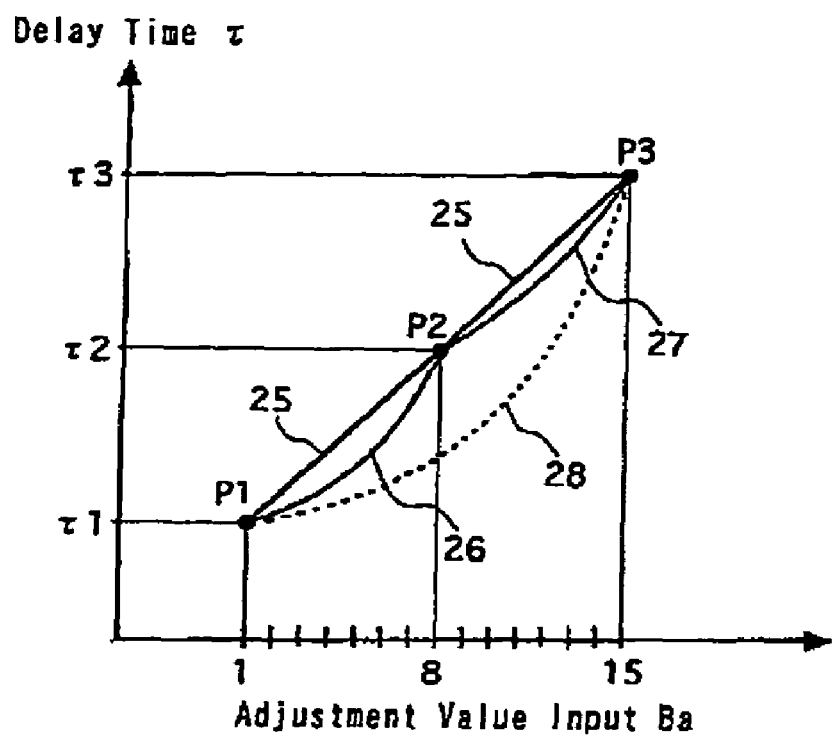
FIG. 24 is a view showing the relationship of a delay adjustment voltage to a adjustment value input in the third embodiment.

In each circuit of FIG. 22 and FIG. 23, the relation of the output voltage of this circuit, that is, the delay adjustment voltage Va, to the adjustment value input Ba can be calculated by the principle of the R-2R ladder. The result is shown in Table 2. The relation of the delay adjustment voltage Va to the delay adjustment value input Ba is shown in FIG. 24.

The circuit, which shows the constituting principle as shown in FIG. 21, can be constituted with FET, as in the second embodiment. In this case, it is possible to reduce the chip area by using FET, which can be easily put into an LSI.

Figure 25:
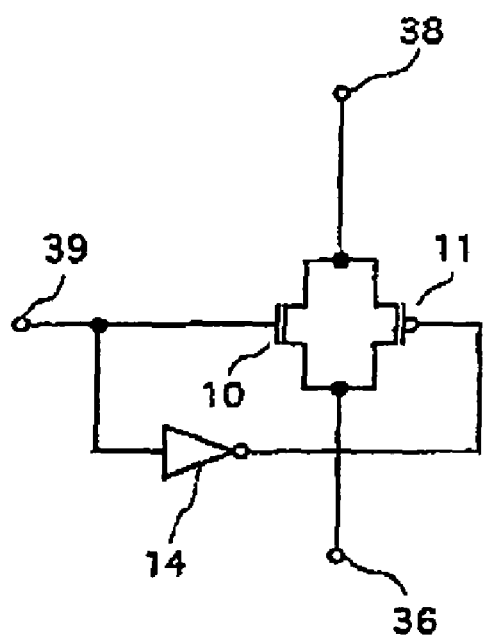
FIG. 25 is a circuit diagram showing another example where a resistor and a switch of the generating circuit for a delay adjustment voltage is formed of FET.

In this case, the resistors 41 and 42 can be constituted with the circuit shown in FIG. 17. Further, an example in which the circuits in series for the resistor 43 and the switch 44 are constituted with FET is shown in FIG. 25. In FIG. 25, 10 is an N channel FET, 11 is a P channel FET, 14 is an inverter, 36 and 38 are terminals of a switch, and 39 is an input terminal for a switching control of the switch.

A signal from the terminal 39 is directly connected to the gate of FET 10, and a signal through inverter is connected to the gate of FET 11. The source and the drain of FET 10 and FET 11 are connected in parallel.

When a signal input of 39 is "1", that is, it is a Vdd voltage, FET 10 and FET 11 conducts with a specified resistance value. When the signal input is "0", that is, it is a GND voltage, FET 10 and FET 11 are turned off. The resistance value between source and drain being connected in parallel, becomes a specified value by performing an optimal design in dimension and configuration for FETs 10 and 11.

According to the circuit in FIG. 25, a similar configuration can also be obtained in FIG. 21 for a circuit in series with the resistor 45 and the switch 46a, 46b, or 46c; and for a circuit in series with the resistor 47 and the switch 48a, 48b, or 48c.

Figure 26:
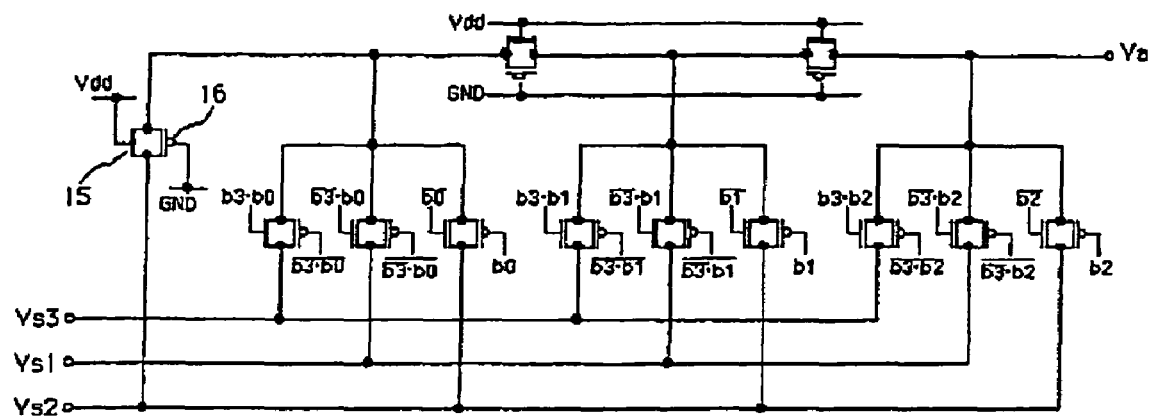
FIG. 26 is a circuit explanatory view showing a configuration example of a generating circuit for a delay adjustment voltage of the second embodiment.

FIG. 26 is a delay adjustment voltage generating circuit where the delay adjustment voltage generating circuit MUX in FIG. 21 is constituted by FETs in FIG. 17 and FIG. 25. 15 is an N channel FET, and 16 is a P channel FET.

It is possible to configure and reduce the chip area by using FET which can be easily put into an LSI. It is further possible to generate a delay adjustment voltage Va with a small amount of error because of use of a piece-wise linear approximation. It is particularly preferable to adjust a digital circuit system on which a delay adjustment circuit system of the present invention is implemented, using a genetic algorithm.

Further, it is possible to replace the delay circuit D by another constitution in the first embodiment to the third embodiment. Another constitution for the delay circuit D is shown in FIG. 27.

Figure 27:
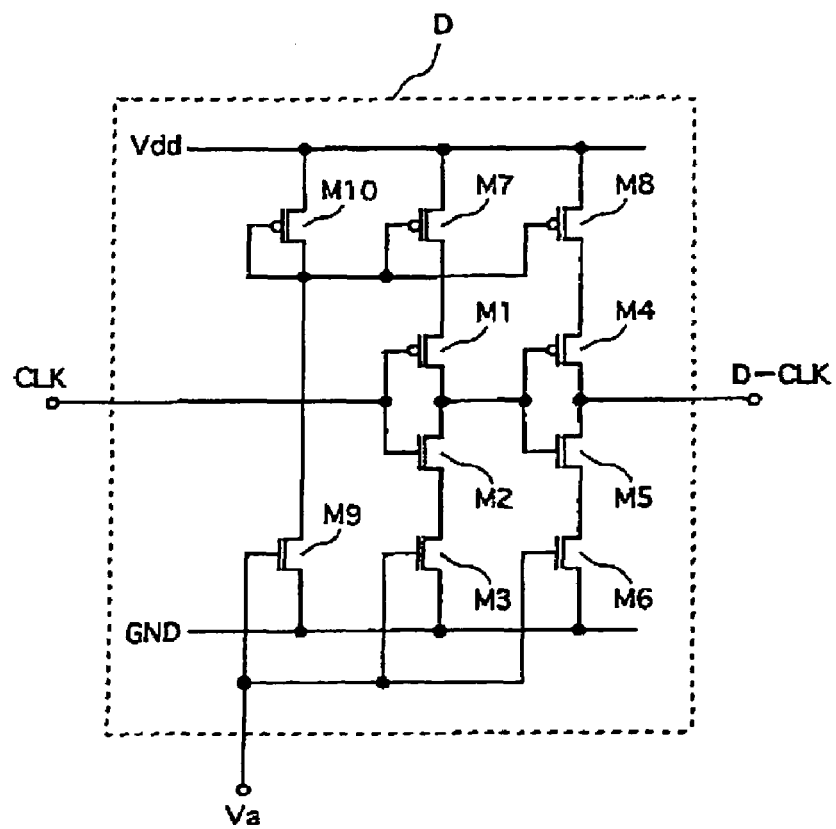
FIG. 27 is a view showing another configuration example of a delay circuit D.

In FIG. 27, the same reference symbols as those in FIG. 2 show the same components as FIG. 2. Each of M7, M8, M9 and M10 is a P channel FET, and M9 is an N channel FET.

In FIG. 27, FET M7 is connected in serial above M1 an M2 on the inverter thereof, and FET M8 is connected in serial above M4 and M5 on the inverter thereof. To generate gate bias voltage of M7 and M8 for a current control FET, one which connects FET M9 and FET M10 in serial is added.

Although the gate bias for FET M3 and M6 is the delay adjustment voltage Va as described above, FET M10 connects the gate terminal with the drain terminal, and the gate bias for FET M3 and M6 becomes the constitution of so-called a current mirror circuit which supplies electricity to a gate bias for FET M7, M8 from this point.

In the same way, while the current of FET M3 and M6 is above-mentioned by the delay adjustment voltage Va based on the current/voltage characteristics in FIG. 3, in a similar way, the current of FET M7 and M8 is above-mentioned by the delay adjustment voltage Va based on the current/voltage characteristics.

The generation of the delay time is the same as the delay circuit in FIG. 2. However, in this delay circuit in FIG. 27, since the current of FET M1 and M4 is above-mentioned by M7 and M8, FET M 7 and M8 for determining an amount of delay are further added. For this, the delay circuit in the case of FIG. 27 can realize a larger delay time than the case of the delay circuit D of FIG. 2. In this case, a better symmetry for the waveform can be obtained.

Figure 28:
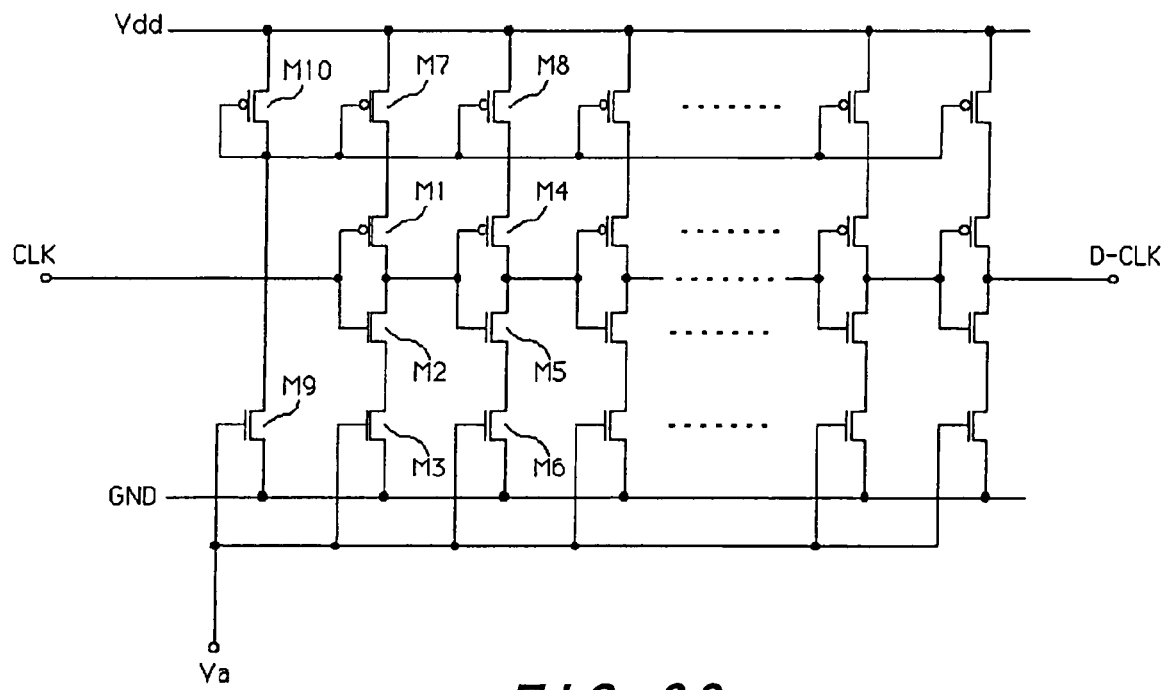
FIG. 28 is a circuit diagram of a delay circuit employing a bias generating circuit functioning as a common circuit.

Incidentally, in the case of using the delay time as the delay synchronizing loop circuit represented by FIG. 9, while the delay circuits D (Ds) is put in the form of multistage, it is possible to be in common with a bias generating circuit formed of M9 and M10. In other words, as shown in FIG. 28, in case of making the bias generating circuit which becomes of M9 and M10 a common bias generating circuit, the circuit dimension decreases by just that much, and to spare the chip area.

In a delay circuit in the first embodiment to the third embodiment, as shown in FIG. 4, a delay is generated by using the capacitance Cs1 and Cs2, consisting of the stray capacitance and FET, but the capacitance may be positively added to the part of the capacitance Cs1, Cs2. The capacitance in this case is the capacitance consisted of metal electrode, or the gate capacitance of FET, etc. In this case it is possible to extend the delay time.

In the embodiment as described above, although one kind of the output for CLK is considered, it is adaptable in the case where a plurality of different amount of delay D-CLK is generated. In this case, the number of the delay circuit D and the delay adjustment generate circuit MUX to be prepared is the same as the number of the different amount of delay D-CLK, and the delay synchronizing loop circuit DLL1 to DLL3 can standardize. For this reason, it is possible to make efficient use of the chip area.

Furthermore, the method to improve the stabilization of the synchronizing loop circuit DLL1 to DLL3 is added. When the delay synchronizing loop circuits DLL1 to DLL3 boot up, there is possibility that the amount of the delay circuit D deviates from the standard amount to a large extent by the excessive amount of output voltage of loop-filter 6. In this case, the operation of the delay synchronizing loop circuit becomes unsteady, because the deviation of phase of the signal input into phase comparator becomes excessive. There is also a possibility to have an abnormal operation in which the phase difference of an input signal of the comparator 5 does not become one period of a clock signal CLK, but two or more than two periods thereof.

Figure 29:
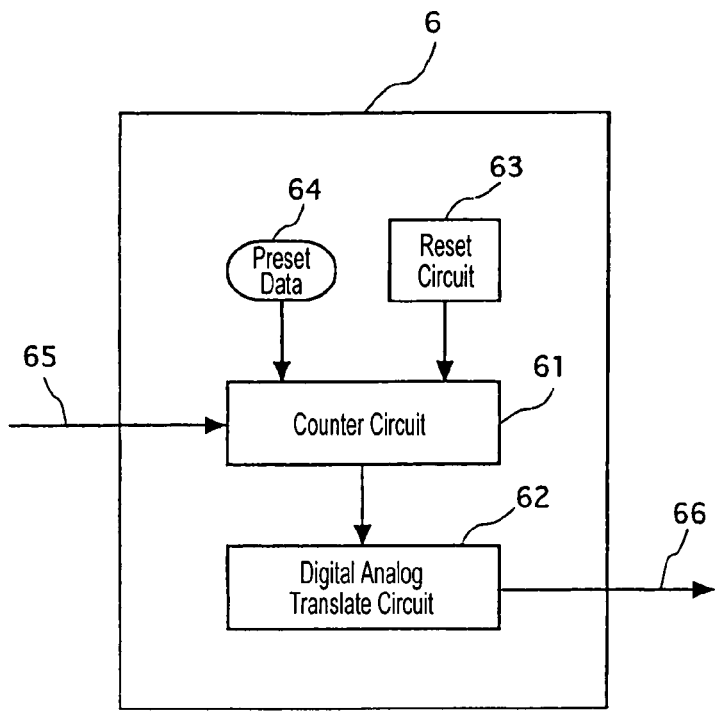
FIG. 29 is an explanatory view showing another configuration example of a loop-filter.

After switching on, the unsteadiness can be excluded by pre-charging the output voltage of the loop-filter 6 up to the near value at steady state or more similar value to Vdd. The structure for this is illustrated in FIG. 29. In FIG. 29, 6 is loop-filter, 61 is a counter circuit, 62 is digital analog translate circuit, 63 is a reset circuit, 64 is preset data, 65 is the signal of the information of the phase difference, 66 is an output voltage of loop-filter.

The signal of the information of the phase difference, which is the output of the phase different comparator of the delay synchronizing loop circuits DLL1 to DLL3, is input into the counter circuit 61. Based on this signal 65 of information of the phase difference, counter 61 makes counting of up-count or down-count. The output of counter circuit 61, input into digital analog translate circuit, translated into output signal 66 which is the voltage of the analog by the digital translate circuit 62, becomes the output of the loop-filter.

When power source is switched into the digital system including the delay circuit system 1, the reset circuit 63 detects the excessive state of the power source input into the delay system, and the counter circuit 61 loads preset data into the register in the circuit. When digital system including the delay circuit system 1 is made resetting, the operation is done as well.

The data by which an output voltage in a steady state is output is recorded as the preset data 64. Accordingly, even when a digital system including the delay circuit system 1 is started by turning it on or a system is reset, a delay synchronizing loop circuit can be quickly and steadily booted, hence making it possible to prevent an abnormal operation.

INDUSTRIAL APPLICABILITY

In a digital processing device having a pulse signal delay circuit as described above, when the configuration of a number of inverters which is a conventional circuit and that of a logic circuit of a multiplexer are compared, a circuit area becomes ⅕ when assigning of delay is 4 bits, and ⅒ when it is 6 bits, hence greatly reducing a chip area for an LSI.

Under an environment condition on the temperature, although the delay time of the circuit in the conventional Circuit changes about 1.5 times for the change of the ambient temperature from −10° C. to 80° C. In the delay circuit according to the present invention, it is possible to make a setting delay time to be constant independent of the change of temperature, by setting up the function to compensate the change of the temperature.

Furthermore it is possible to make setting of the delay time of high resolution.

The invention claimed is:

1. A digital circuit comprising:
a delay circuit that provides variable timing of a clock signal;
a delay amount of the delay circuit;
a delay synchronizing loop that stabilizes the delay amount; and
a delay amount setting voltage generating circuit that synthesizes two or more reference voltages,
wherein the delay amount setting voltage generating circuit synthesizes the reference voltages based on a piece-wise linear approximation.

2. A digital circuit comprising:
a delay circuit that provides variable timing of a clock signal;
a delay amount of the delay circuit;
a delay synchronizing loop that stabilizes the delay amount; and
a delay amount setting voltage generating circuit that synthesizes two or more reference voltages,
wherein the delay amount setting voltage generating circuit is a voltage dividing type circuit.

3. A digital circuit comprising:
a delay circuit that provides variable timing of a clock signal;
a delay amount of the delay circuit;
a delay synchronizing loop that stabilizes the delay amount; and
a delay amount setting voltage generating circuit that synthesizes two or more reference voltages,
wherein the delay amount setting voltage generating circuit is a ladder type circuit.

* * * * *